(12) United States Patent
Tanaka et al.

(10) Patent No.: US 12,328,984 B2
(45) Date of Patent: Jun. 10, 2025

(54) DISPLAY DEVICE AND METHOD FOR MANUFACTURING DISPLAY DEVICE

(71) Applicant: NISSHA CO., LTD., Kyoto (JP)

(72) Inventors: Shun Tanaka, Kyoto (JP); Masaru Terashita, Kyoto (JP); Jun Sasaki, Kyoto (JP); Chuzo Taniguchi, Kyoto (JP); Kenichiro Suzuki, Kyoto (JP)

(73) Assignee: Nissha Co., Ltd., Kyoto (JP)

( * ) Notice: Subject to any disclaimer, the term of this patent is extended or adjusted under 35 U.S.C. 154(b) by 252 days.

(21) Appl. No.: 18/031,996

(22) PCT Filed: Oct. 14, 2021

(86) PCT No.: PCT/JP2021/038018
§ 371 (c)(1),
(2) Date: Apr. 14, 2023

(87) PCT Pub. No.: WO2022/080445
PCT Pub. Date: Apr. 21, 2022

(65) Prior Publication Data
US 2023/0395000 A1    Dec. 7, 2023

(30) Foreign Application Priority Data

Oct. 16, 2020    (JP) ................................. 2020-174541

(51) Int. Cl.
*G09F 13/04*    (2006.01)
*B60K 35/00*    (2024.01)
(Continued)

(52) U.S. Cl.
CPC ........... *H10H 20/857* (2025.01); *B60K 35/00* (2013.01); *G09F 13/22* (2013.01);
(Continued)

(58) Field of Classification Search
CPC ................................................ G02F 1/133603
See application file for complete search history.

(56) References Cited

U.S. PATENT DOCUMENTS 10,941,934 B2    3/2021  Nakatsukasa
10,962,702 B2    3/2021  Yamane et al.
(Continued)

FOREIGN PATENT DOCUMENTS

JP    2004361182 A    12/2004
JP    2008129094 A     6/2008
(Continued)

OTHER PUBLICATIONS

International search report PCT/JP2021/038018 dated Dec. 21, 2021 (pp. 1-2).

*Primary Examiner* — Nan-Ying Yang
(74) *Attorney, Agent, or Firm* — Millen, White, Zelano & Branigan P.C.; William F. Nixon

(57) ABSTRACT

A first groove is formed in a first main surface of a light guide member. A decorative layer is molded with the light guide member and provided on a second main surface of the light guide member. The decorative layer includes a first light-emitting portion that radiates the visible light emitted from a first light-emitting element from the light guide member and a second light-emitting portion that radiates the visible light emitted from the second light-emitting element from the light guide member. The first light absorbing member is disposed on a first groove bottom of the first groove, and has an absorptivity of visible light, which is higher than that of the light guide member. The first groove is positioned to block an optical path from the first light-emitting element toward a second region and an optical path from the second light-emitting element toward a first region.

20 Claims, 23 Drawing Sheets

(51) Int. Cl.
  *G09F 13/22* (2006.01)
  *H01L 25/075* (2006.01)
  *H01L 33/62* (2010.01)
  *H10H 20/857* (2025.01)
  *B60K 35/22* (2024.01)
  *H10H 20/01* (2025.01)

(52) U.S. Cl.
  CPC .......... *H01L 25/0753* (2013.01); *B60K 35/22* (2024.01); *H10H 20/0364* (2025.01)

(56) References Cited

U.S. PATENT DOCUMENTS

2014/0376257 A1* 12/2014 Sawada .................. G06F 3/041
  362/606
2020/0110212 A1* 4/2020 Yamane ............... G02B 6/0023

FOREIGN PATENT DOCUMENTS

| JP | 2013205530 A | 10/2013 |
| JP | 2019168571 A | 10/2019 |
| JP | 2020061352 A | 4/2020 |

* cited by examiner

DISPLAY DEVICE AND METHOD FOR MANUFACTURING DISPLAY DEVICE

TECHNICAL FIELD

The present invention relates to a display device and a method for manufacturing a display device, and more particularly, to a display device and a method for manufacturing a display device that guides visible light for display with resin.

BACKGROUND ART

Conventionally, for example, as described in Patent Document 1 (JP 2008-129094 A), a display device in which a light guide plate and a display plate are combined has been known. In the light guide plate of Patent Document 1, a groove is provided in the light guide plate in order to divide an optical path from a plurality of light emitting diodes (LEDs) to the display plate into a plurality of optical paths.

CITATION LIST

Patent Literature

Patent Document 1: JP 2008-129094 A

SUMMARY OF INVENTION

Technical Problem

When the resin forming the light guide plate is thick and the optical path is divided by the deep groove as in Patent Document 1, the leakage of visible light to the adjacent optical path in the light guide plate is easily reduced.

However, when the light guide plate is thin, the strength of the light guide plate needs to be maintained, and thus a ratio of the depth of the groove to the thickness of the light guide plate cannot be increased. When the ratio of the depth of the groove to the thickness of the light guide plate cannot be increased, it is difficult to reduce the leakage of visible light to the adjacent optical path.

An object of the present invention is to reduce, in a display device in which an optical path is divided by forming grooves in a thin light guide member, the leakage of visible light to an adjacent optical path.

Solution to Problem

Some aspects will be described below as means to solve the problems. These aspects can be combined randomly as necessary.

A display device according to an aspect of the present invention includes a light guide member that is made of resin and allows visible light to pass through the light guide member, a first light-emitting element, a second light-emitting element, a decorative layer, and a light absorbing member. The light guide member includes a first main surface and a second main surface facing the first main surface, and a first groove is formed in the first main surface. The first light-emitting element is disposed on the first main surface of the light guide member and arranged to emit visible light into the light guide member. The second light-emitting element is disposed on the first main surface or the second main surface of the light guide member and arranged to emit visible light into the light guide member. The decorative layer is molded integrally with the light guide member and provided on at least one of the first main surface and the second main surface of the light guide member, and includes a first light-emitting portion allowing the visible light emitted from the first light-emitting element to be radiated from the light guide member to the outside and a second light-emitting portion allowing the visible light emitted from the second light-emitting element to be radiated from the light guide member to the outside. The light absorbing member is disposed on at least one of a first groove bottom of the first groove and a first groove facing portion of the second main surface, which faces the first groove bottom, and has a higher absorptivity of visible light than the light guide member. The light guide member includes a first region in contact with one side surface of the first groove and a second region in contact with the other side surface of the first groove. The first light-emitting element and the first light-emitting portion are disposed in the first region, and the second light-emitting element and the second light-emitting portion are disposed in the second region. The first groove is disposed at a position in which an optical path from the first light-emitting element toward the second region is blocked and an optical path from the second light-emitting element toward the first region is blocked.

In the display device configured as just described, the optical path from the first light-emitting element toward the second region is blocked by the first groove, and the light absorbing member can reduce entry of the visible light emitted from the first light-emitting element into the second region through the clearance between the first groove and the second main surface. As a result, the leakage of the visible light from the optical path of the first light-emitting element to the optical path of the second light-emitting element can be reduced. Similarly, the optical path from the second light-emitting element toward the first region is blocked by the first groove, and the light absorbing member can reduce entry of the visible light emitted from the second light-emitting element into the first region through the clearance between the first groove and the second main surface. As a result, the leakage of the visible light from the optical path of the second light-emitting element to the optical path of the first light-emitting element can be reduced.

In the above-described display device, the light absorbing member may be formed of a rod-shaped member disposed in contact with the first groove bottom of the first groove and not in contact with the side surface of the first groove. In the display device configured as just described, the leakage of the visible light through the clearance between the first groove bottom and the second main surface is reduced by the light absorbing member. One side surface of the first groove can reflect the visible light of the first optical path toward the first optical path without reducing the visible light by the light absorbing member, and the other side surface can reflect the visible light of the second optical path toward the second optical path without reducing the visible light by the light absorbing member. As a result, even when the light absorbing member is disposed in the first groove, a decrease in luminance of the first light-emitting portion illuminated by the first light-emitting element can be suppressed, and a decrease in luminance of the second light-emitting portion illuminated by the second light-emitting element can be suppressed.

The above-described display device may be configured such that a depth of the first groove of the light guide member is smaller than a distance between the first groove bottom and the second main surface. In the display device configured as just described, the light guide member is less likely to break at a portion of the first groove although the light guide member is thin.

In the above-described display device, the light guide member may include a second groove and a third groove formed in the first main surface in addition to the first groove. The light absorbing members may be disposed at a second groove bottom of the second groove and a third groove bottom of the third groove or at a second groove facing portion and a third groove facing portion of the second main surface. The second groove facing portion and the third groove facing portion respectively face the second groove bottom and the third groove bottom. The first groove and the second groove may be disposed to sandwich the first region, and the first groove and the third groove may be disposed to sandwich the second region. In the display device configured as just described, the visible light entering the first region from the second groove side can be reduced by the second groove and the light absorbing member. In addition, the visible light entering the second region from the third groove side can be reduced by the third groove and the light absorbing member. As a result, the second groove and the light absorbing member can suppress a decrease in light and dark contrast of the first light-emitting portion between when the first light-emitting element emits light and when the first light-emitting element does not emit light. Similarly, the third groove and the light absorbing member can suppress a decrease in light and dark contrast of the second light-emitting portion between when the second light-emitting element emits light and when the second light-emitting element does not emit light.

A display device according to another aspect of the present invention includes a light guide member, a first light-emitting element, a second light-emitting element, and a decorative layer. The light guide member is made of resin, allows visible light to pass through the light guide member, and includes a first main surface and a second main surface facing the first main surface. A first groove is formed in the first main surface. The first light-emitting element is disposed on the first main surface of the light guide member and arranged to emit visible light into the light guide member. The second light-emitting element is disposed on the first main surface or the second main surface of the light guide member and arranged to emit visible light into the light guide member. The decorative layer is molded integrally with the light guide member and provided on at least one of the first main surface and the second main surface of the light guide member, and includes a first light-emitting portion allowing the visible light emitted from the first light-emitting element to be radiated from the light guide member to the outside and a second light-emitting portion allowing the visible light emitted from the second light-emitting element to be radiated from the light guide member to the outside. The light guide member includes a first region in contact with one side surface of the first groove and a second region in contact with the other side surface of the first groove. The first light-emitting element and the first light-emitting portion are disposed in the first region, and the second light-emitting element and the second light-emitting portion are disposed in the second region. At least a portion of the first light-emitting element is disposed in a recess of the light guide member so as to be located between the first main surface and the second main surface of the light guide member. At least a portion of the second light-emitting element is disposed in a recess of the light guide member so as to be located between the first main surface and the second main surface of the light guide member. The first groove is disposed at a position in which an optical path from the first light-emitting element toward the second region is blocked and an optical path from the second light-emitting element toward the first region is blocked.

In the display device configured as just described, the optical path from the first light-emitting element toward the second region and the optical path from the second light-emitting element toward the first region are blocked by the first groove. Since at least a portion of the first light-emitting element and the second light-emitting element can be disposed in the recess of the light guide member, the distance between the first light-emitting element and the first light-emitting portion and the distance between the second light-emitting element and the second light-emitting portion can be reduced while the thickness of the light guide member is reduced. In addition, the leakage of the visible light from the optical path of the first light-emitting element to the optical path of the second light-emitting element and the leakage of the visible light from the optical path of the second light-emitting element to the optical path of the first light-emitting element can be reduced.

The above-described display device may further include a circuit film including a wiring pattern, the first light-emitting element and the second light-emitting element being electrically connected to the wiring pattern, the circuit film being disposed on the first main surface of the light guide member and integrally molded with the light guide member. In the display device configured as just described, the thickness in a direction from the first main surface toward the second main surface of the display device can be easily reduced.

In the above-described display device, the decorative layer may include a metal layer or a low refractive index layer in a portion facing the first region and the second region. In the display device configured as just described, the visible light can be suppressed from diffusing in the first region and the second region, and a decrease in luminance of the first light-emitting portion and the second light-emitting portion can be suppressed.

A method for manufacturing a display device according to an aspect of the present invention includes a molding step, an element placing step, a groove forming step, and a light absorbing member placing step. In the molding step, a circuit film is integrally molded on a first main surface of a light guide member that is made of a resin and allows visible light to pass through the light guide member, and a decorative layer is integrally molded on a second main surface of the light guide member. In the element placing step, a first light-emitting element and a second light-emitting element are electrically connected to the circuit film, and the first light-emitting element and the second light-emitting element are placed such that the first light-emitting element and the second light-emitting element are configured to emit visible light into the light guide member. In the groove forming step, the first main surface of the light guide member is cut to form a first groove passing between the first light-emitting element and the second light-emitting element. In the light absorbing member placing step, a light absorbing member is placed, the light absorbing member being disposed on at least one of a first groove bottom of the first groove and a first groove facing portion of the second main surface, the first groove facing portion facing the first groove bottom, the light absorbing member having a higher absorptivity of visible light than the light guiding member. The display device is manufactured such that the decorative layer includes a first light-emitting portion and a second light-emitting portion. The first light emitting portion is a portion allowing the visible light emitted from the first light-emitting element to be radiated from the light guide member to an outside. The second light emitting portion is a portion allowing the visible light emitted from the second light-emitting element to be radiated from the light guide member to the outside. The display device is manufactured such that the light guide member includes a first region and a second region. In the method for manufacturing a display device, the first region is in contact with one side surface of the first groove, and the first light-emitting element and the first light-emitting portion are disposed in the first region. Further, the second region is in contact with the other side surface of the first groove, and the second light-emitting element and the second light-emitting portion are disposed in the second region. Furthermore, the first groove is disposed at a position in which an optical path from the first light-emitting element toward the second region is blocked and an optical path from the second light-emitting element toward the first region is blocked.

In the method for manufacturing a display device configured as just described, the optical path from the first light-emitting element toward the second region is blocked by the first groove, and the light absorbing member can reduce entry of the visible light emitted from the first light-emitting element into the second region through the clearance between the first groove and the second main surface. As a result, a display device that can reduce the leakage of the visible light from the optical path of the first light-emitting element to the optical path of the second light-emitting element can be obtained. In the method for manufacturing a display device configured as just described, since the first groove is formed by cutting after the light guide member is molded, sink marks of resin that may be generated when the groove is formed at the same time as molding can be prevented and the display device with less distortion of the decorative layer can be provided.

In the method for manufacturing a display device described above, the molding step and the element placing step may be performed by electrically connecting the first light-emitting element and the second light-emitting element to the circuit film and thereafter forming the circuit film by insert-molding and forming the decorative layer by in-mold molding. In the method for manufacturing a display device configured as just described, the first light-emitting element and the second light-emitting element can be easily placed into the light guide member.

Advantageous Effects of Invention

According to the display device and the method for manufacturing the same of the present invention, a display device can be provided that reduces leakage of visible light into an adjacent optical path even when the device includes a thin light guide member.

DESCRIPTION OF EMBODIMENTS

Figure 1:
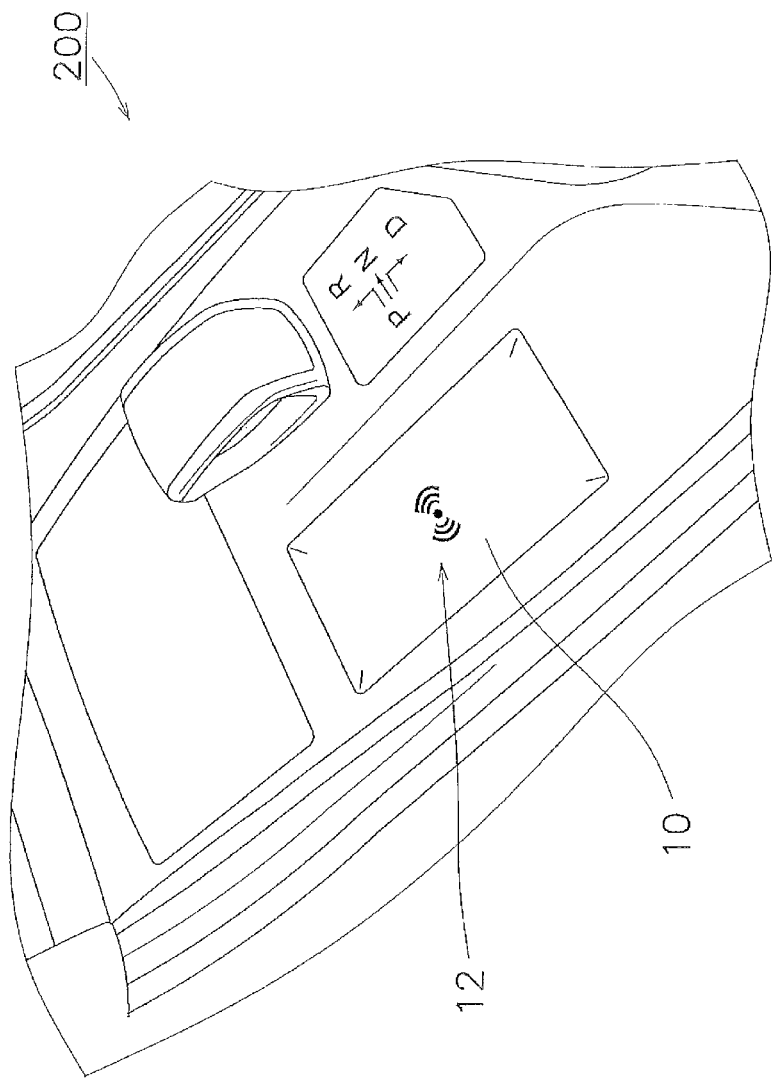
FIG. 1 is a perspective view of a center console to which a display device is applied.
Figure 2:
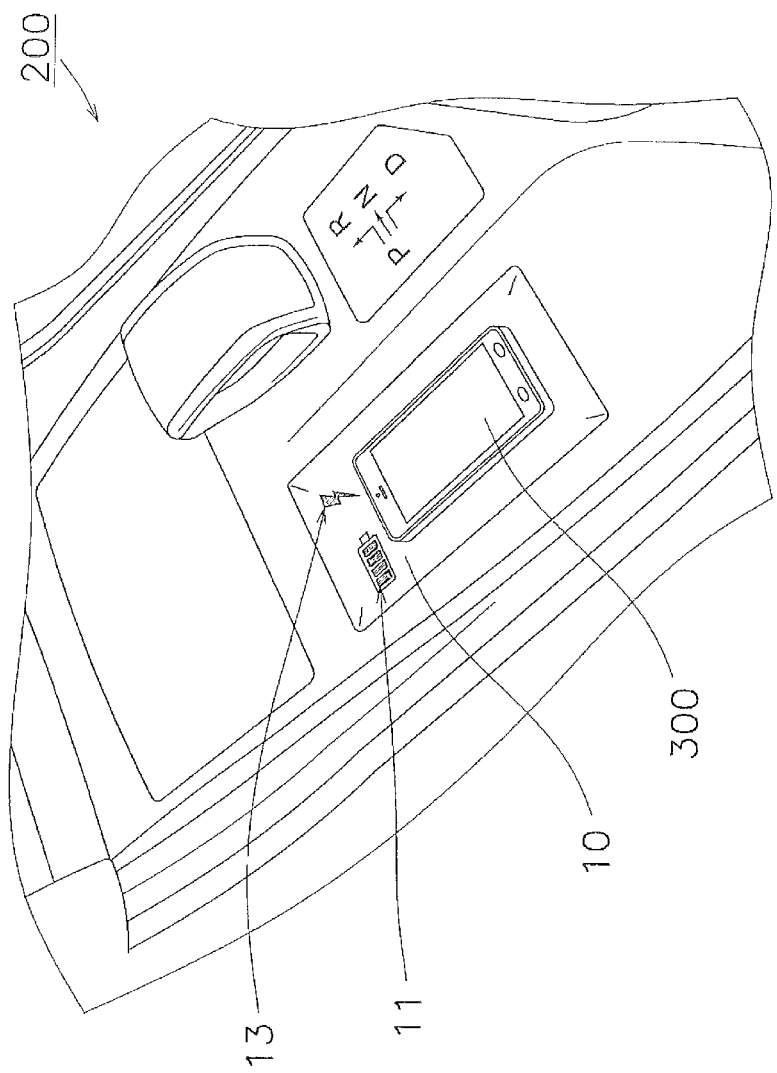
FIG. 2 is a perspective view illustrating a state in which the center console of FIG. 1 is filled with a mobile phone.
Figure 3:
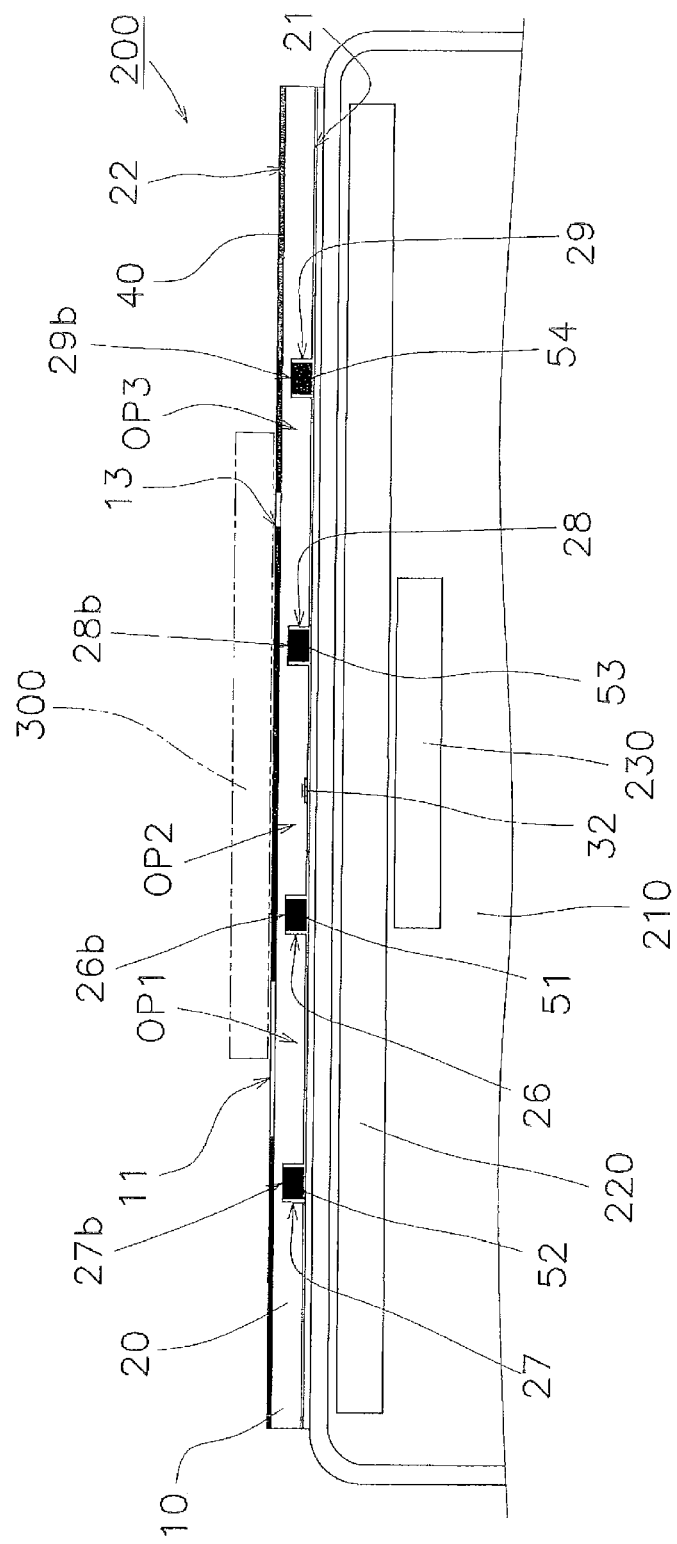
FIG. 3 is a cross-sectional view illustrating a positional relationship among the display device of FIG. 1, a console box, and the mobile phone.

First Embodiment (1) Overview of Display Device
(1-1) Overview of Display Device FIGS. 1, 2, and 3 illustrate a display device 10 mounted on a center console 200 of an automobile. The center console 200 has a function of charging a mobile phone 300 illustrated in FIGS. 2 and 3. In order to realize the charging function of the mobile phone 300, a charging coil 220 for generating magnetic flux is disposed in a console box 210 of the center console 200. As one method for efficiently charging the mobile phone 300, it is conceivable to increase the ratio of magnetic flux passing through the mobile phone 300 of the magnetic flux generated by the charging coil 220. Since the magnetic flux generated by the charging coil 220 diverges as the magnetic flux is separated from the charging coil 220, the mobile phone 300 and the charging coil 220 are brought closer to each other and thereby the ratio of magnetic flux passing through the mobile phone 300 is increased. Note that a current for generating magnetic flux is supplied to the charging coil 220, for example, from a power supply (not illustrated).

FIG. 3 illustrates a cross-section of the center console 200 in a location in which the mobile phone 300 is placed. As illustrated in FIG. 3, the display device 10 is disposed between the charging coil 220 and the mobile phone 300. Therefore, the mobile phone 300 can be brought closer to the charging coil 220 as the display device 10 is thinner.

FIG. 1 illustrates the center console 200 in a state where the mobile phone 300 is not placed on the display device 10. A second icon 12 is displayed on the display device 10 in the state illustrated in FIG. 1. The second icon 12 is an icon for indicating a placement position for charging the mobile phone 300.

FIG. 2 illustrates the center console 200 in a state where the mobile phone 300 is placed on the display device 10. A first icon 11 and a third icon 13 are displayed on the display device 10 in the state illustrated in FIG. 2. The third icon 13 is an icon for indicating that the mobile phone 300 is being charged. The first icon 11 is an icon for indicating to what extent the mobile phone 300 is charged. For example, the first icon 11 lights up, and thus a user can know that charging of the mobile phone 300 is completed.

In order to detect the placed mobile phone 300, for example, a detection device (not illustrated) is disposed in the console box 210. The display device 10, the charging coil 220, the power supply, and the detection device are connected to a control device 230. Before the mobile phone 300 is placed on the display device 10, the control device 230 controls the display device 10 to display the second icon 12 as illustrated in FIG. 1. When the mobile phone 300 is placed on the display device 10, the control device 230 receives, from the detection device, information related to the detection indicating that the mobile phone 300 is placed. When the mobile phone 300 is placed, the control device 230 simultaneously allows a current to be supplied from the power supply to the charging coil 220 and controls the display device 10 to stop displaying the second icon 12 and display the third icon 13. Then, when the battery of the mobile phone 300 is fully charged, the display device 10 is controlled to display the first icon 11. The control device 230 is connected to the display device 10 in order to perform such controls.

(1-2) Configuration of Display Device

Figure 4:
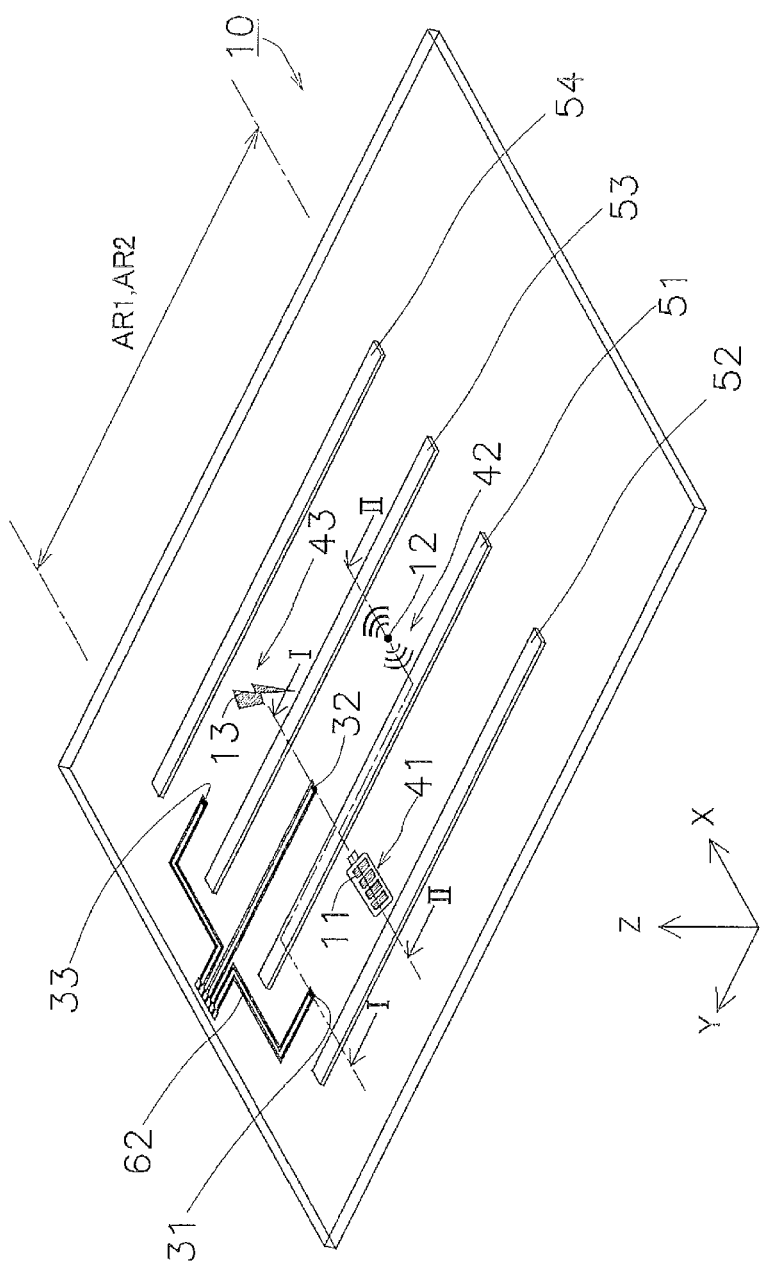
FIG. 4 is a perspective view of the display device illustrated in FIG. 1.
Figure 5:
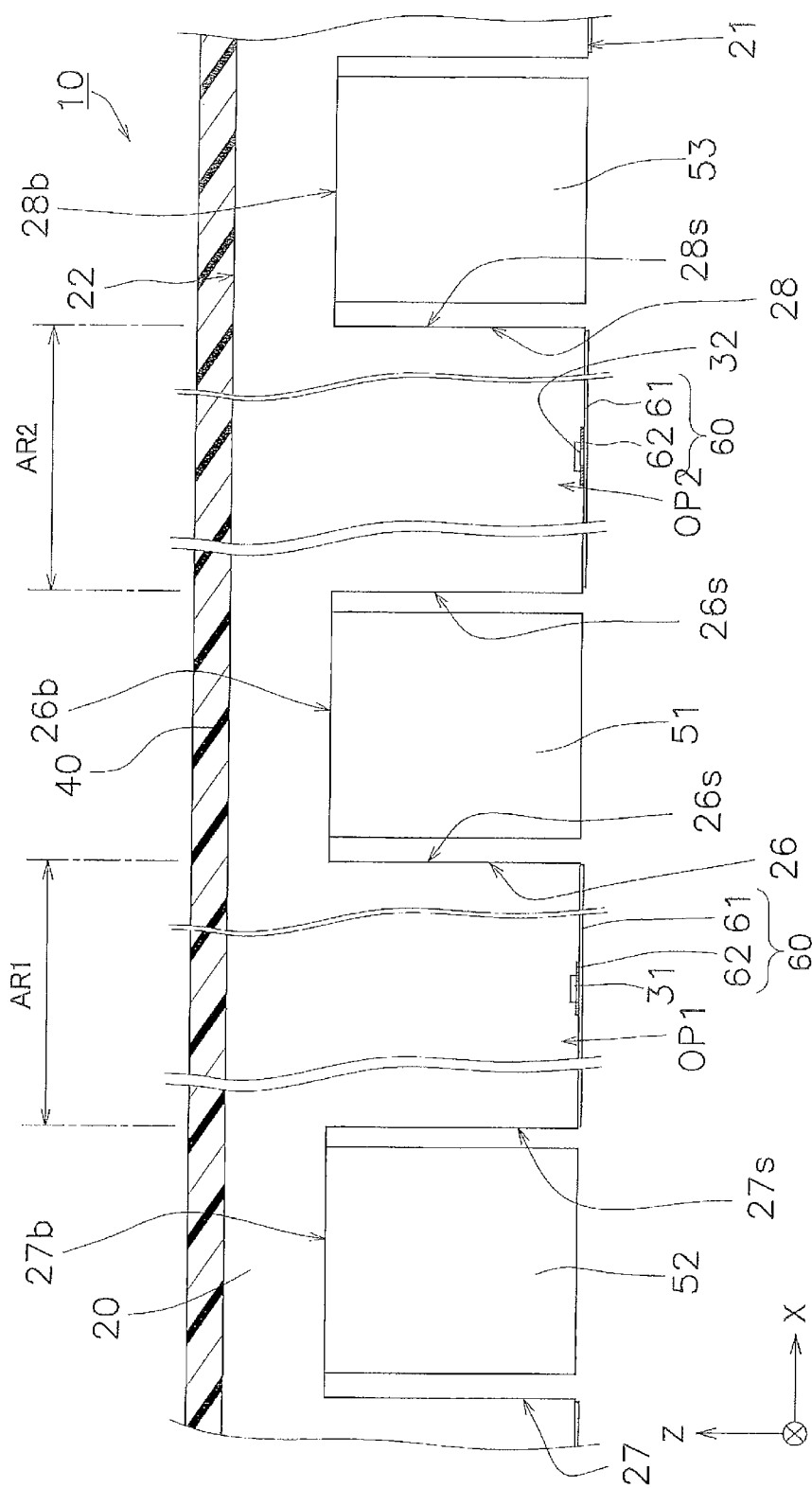
FIG. 5 is a cross-sectional view illustrating a cross-section of the display device taken along the line I-I in FIG. 4.
Figure 6:
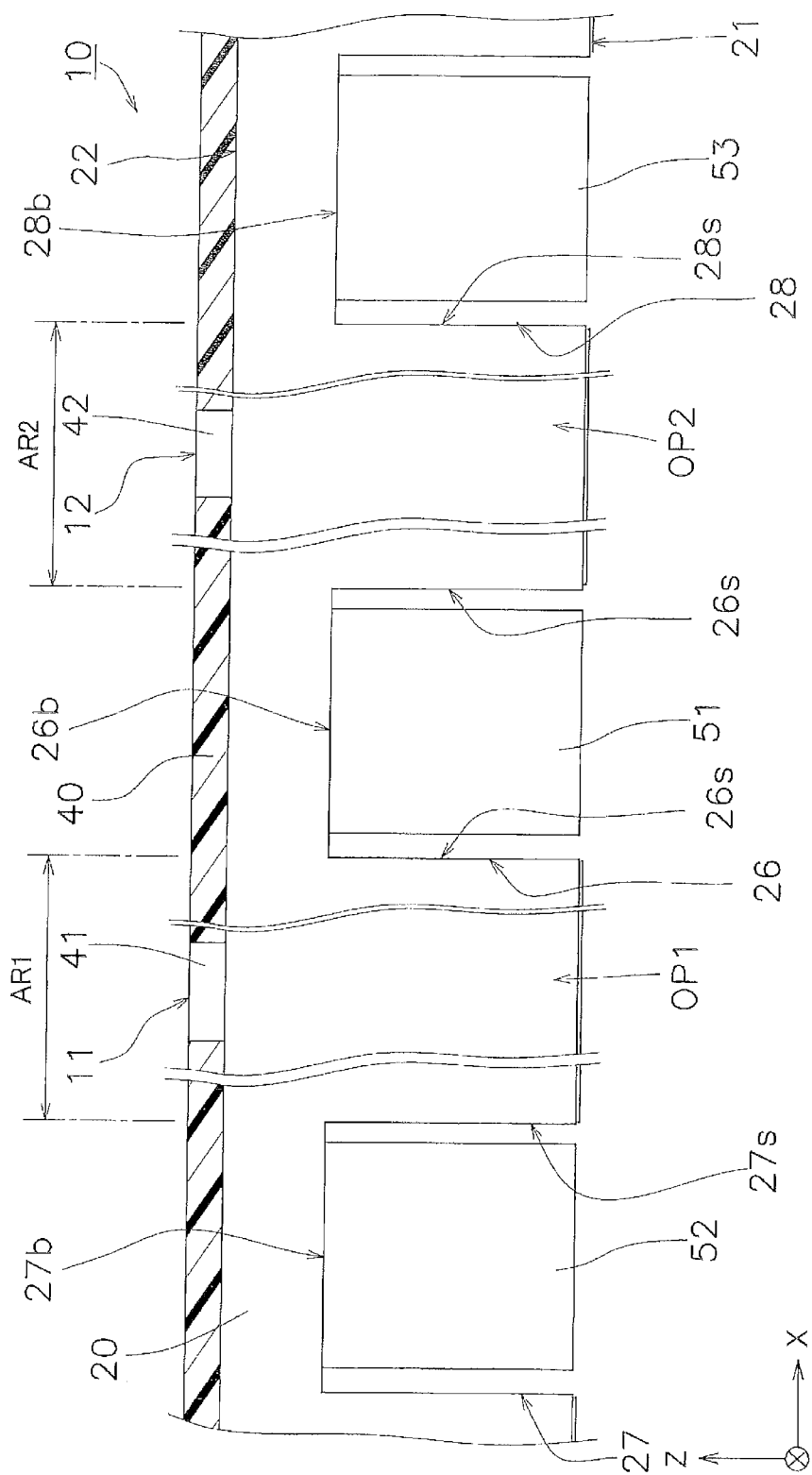
FIG. 6 is a cross-sectional view illustrating a cross-section of the display device taken along the line II-II in FIG. 4.

FIG. 4 illustrates a state when the display device 10 is viewed obliquely from above. Note that in FIG. 4, portions other than the icons of a decorative layer are omitted. FIG. 5 is an enlarged view of a portion of a cross-section of the display device 10 taken along the line I-I in FIG. 4. FIG. 6 is an enlarged view of a portion of a cross-section of the display device 10 taken along the line II-II in FIG. 4. Note that at the time of describing the configuration of the display device 10, the orthogonal coordinates illustrated in FIG. 4 may be used.

As illustrated in FIGS. 3 and 4, the display device 10 includes a light guide member 20, a first LED 31, a second LED 32, a third LED 33, a decorative layer 40, a first light absorbing member 51, a second light absorbing member 52, a third light absorbing member 53, and a fourth light absorbing member 54. Note that hereinafter, the first LED 31 will be described as an example of a first light-emitting element and the second LED 32 will be described as an example of a second light-emitting element.

(1-2-1) Light Guide Member

The light guide member 20 is a resin member through which visible light passes. Examples of thermoplastic resin used for the light guide member 20 include polycarbonate resin, acrylic resin, and ABS resin. The light guide member 20 is a plate-shaped member for guiding visible light of the first LED 31, the second LED 32, and the third LED 33. The light guide member 20 includes a first main surface 21 and a second main surface 22. The thickness of the light guide member 20 is, for example, 5 mm or less, and is preferably 2.5 mm or less.

The decorative layer 40 is provided on the second main surface 22 of the light guide member 20. The first LED 31, the second LED 32, and the third LED 33 are disposed on the first main surface 21 of the light guide member 20. The case where the LED is disposed on the first main surface 21 of the light guide member 20 includes a case where the entire LED is deeply embedded and the entire LED does not reach the first main surface 21 in a cross-sectional view. The first LED 31, the second LED 32, and the third LED 33 are embedded in the light guide member 20. Therefore, at least a portion of the first LED 31, the second LED 32, and the third LED 33 is located between the first main surface 21 and the second main surface 22. Therefore, in this embodiment, the first LED 31, the second LED 32, and the third LED 33 are integrally molded with the light guide member 20 simultaneously with the decorative layer 40, and thus the entireties of the first LED 31, the second LED 32, and the third LED 33 are embedded in the light guide member 20. The places where the entireties of the first LED 31, the second LED 32, and the third LED 33 are embedded are within recesses of the light guide member 20.

A first groove 26, a second groove 27, a third groove 28, and a fourth groove 29 are formed in the first main surface 21 of the light guide member 20. Each of the first groove 26 to the fourth groove 29 extends linearly in the Y-axis direction. The cross-sectional shape cut along the XZ plane of each of the first groove 26 to the fourth groove 29 is a rectangular shape. As illustrated in FIG. 3, the first groove 26 to the fourth groove 29 include a first groove bottom 26*b*, a second groove bottom 27*b*, a third groove bottom 28*b*, and a fourth groove bottom 29*b*, respectively. Further, as illustrated in FIG. 5, the first groove 26 includes two side surfaces 26*s* standing upright from two sides extending in the Y-axis direction of the first groove bottom 26*b*. Similarly, the second groove 27 and the third groove 28 include side surfaces 27*s* and side surfaces 28*s* respectively standing upright from two sides extending in the Y-axis direction of the second groove bottom 27*b* and from two sides extending in the Y-axis direction of the third groove bottom 28*b*. Here, a case where each of the first groove 26 to the fourth groove 29 extends linearly in the Y-axis direction is described, but each of the first groove 26 to the fourth groove 29 may extend in a curved shape in the Y-axis direction. Furthermore, the cross-sectional shape cut along the XZ plane shape of each of the first groove 26 to the fourth groove 29 is not limited to a rectangular shape.

As illustrated in FIGS. 4, 5, and 6, the light guide member 20 includes a first region AR1 and a second region AR2. The first region AR1 is a region in contact with one of the side surfaces 26s of the first groove 26. The second region AR2 is a region in contact with the other of the side surfaces 26s of the first groove 26. In other words, the first region AR1, the first groove 26, and the second region AR2 are arranged side by side in the X-axis direction. The range of the first region AR1 in the X-axis direction is from the side surface 26s of the first groove 26 to the side surface 27s of the second groove 27. The range of the second region AR2 in the X-axis direction is from the side surface 26s of the first groove 26 to the side surface 28s of the third groove 28. The range of the first region AR1 and the second region AR2 in the Y-axis direction is from one end to the other end of the first groove 26. In other words, the lengths of the first region AR1 and the second region AR2 in the Y-axis direction correspond to the length of the first groove 26. The first groove 26 is disposed at a location in which an optical path from the first LED 31 to the second region AR2 is blocked and an optical path from the second LED 32 to the first region AR1 is blocked. By the first groove 26 arranged as just described, the visible light traveling from the first LED 31 toward the second region AR2 is reduced and the visible light traveling from the second LED 32 toward the first region AR1 is reduced.

(1-2-2) First LED to Third LED

The first LED 31, the second LED 32, and the third LED 33 are disposed so as to emit visible light into the light guide member 20. The first LED 31, the second LED 32, and the third LED 33 of this embodiment are embedded in the light guide member 20 by insert-molding so as not to protrude from the first main surface 21 of the light guide member 20. Insert molding of the first LED 31, the second LED 32, and the third LED 33 will be described below. The visible light emitted from the first LED 31 passes through a first optical path OP1 of the light guide member 20 to light up the first icon 11. The visible light emitted from the second LED 32 passes through a second optical path OP2 of the light guide member 20 to light up the second icon 12. The visible light emitted from the third LED 33 passes through a third optical path OP3 of the light guide member 20 to light up the third icon 13. For example, chip LEDs can be used for the first LED 31, the second LED 32, and the third LED 33. The thickness of the chip LED is, for example, 0.4 mm to 2 mm. The chip LED has, for example, a rectangular shape in a planar view and has a size of 1.6 mm×0.8 mm to 3.5 mm×2.8 mm.

(1-2-3) Decorative Layer

The decorative layer 40 is integrally molded with the light guide member 20. The decorative layer 40 is integrally molded with the light guide member 20 by integrating the decorative film and the light guide member 20 by insert molding. Alternatively, the decorative layer 40 is transferred to the light guide member 20 by in-mold molding and thereby is integrally molded with the light guide member 20 (molding step). Here, a case where the decorative layer is transferred and formed by in-mold molding is described as an example, but the decorative layer may be transferred after molding.

The decorative layer 40 includes a first light-emitting portion 41, a second light-emitting portion 42, and a third light-emitting portion 43. The first light-emitting portion 41 is a portion through which the visible light emitted from the first LED 31 is radiated from the light guide member 20 to the outside. The first icon 11 is formed in the first light-emitting portion 41. The visible light emitted from the first LED 31 is radiated from the first light-emitting portion 41 to the outside, and thus the first icon 11 is displayed. The second icon 12 is formed in the second light-emitting portion 42, and the third icon 13 is formed in the third light-emitting portion 43. The visible light emitted from the second LED 32 is radiated from the second light-emitting portion 42 to the outside, and thus the second icon 12 is displayed. The visible light emitted from the third LED 33 is radiated from the third light-emitting portion 43 to the outside, and thus the third icon 13 is displayed.

The decorative layer 40 can be formed of, for example, a light transmissive film through which the visible light passes, a masking layer that is formed on the light transmissive film to block the visible light, and a graphic layer that is formed on the masking layer. The light transmissive film is a transparent resin film having a thickness of, for example, 10 μm to 500 μm. The light transmissive film is selected from, for example, a resin film made of polyester resin, polyethylene terephthalate (PET) resin, acrylic resin, polycarbonate resin, polybutylene terephthalate (PBT) resin, triacetyl cellulose resin, styrene resin, or ABS resin, a multilayer film made of acrylic resin and ABS resin, and a multilayer film made of acrylic resin and polycarbonate resin. The masking layer is formed in a location other than a portion such as the first light-emitting portion 41, the second light-emitting portion 42, and the third light-emitting portion 43, through which the visible light is radiated from the light guide member 20 to the outside. The masking layer is formed on the light transmissive film, for example, by gravure printing or screen printing. The materials forming the masking layer include, for example, resin such as acrylic resin, vinyl chloride vinyl acetate copolymer resin, thermoplastic urethane resin, or polyester resin, and a pigment or dye that is added into the resin.

The graphic layer is a layer used to express a design such as an illustration. For example, the first icon 11, the second icon 12, and the third icon 13 are drawn by the graphic layer. The graphic layer is formed on a base film, for example, by gravure printing or screen printing. The materials forming the graphic layer include, for example, resin such as acrylic resin, vinyl chloride vinyl acetate copolymer resin, thermoplastic urethane resin, or polyester resin, and a pigment or dye that is added into the resin. Also, the graphic layer may have a metallic design formed, for example, by using a printing method or a metal deposition method. In the printing method, for example, aluminum paste or mirror ink can be used. Also, in the metal deposition method, for example, a metal material such as aluminum, tin, indium, or chromium can be used. In addition, a coating layer for protecting the graphic layer may be provided on the graphic layer on the opposite side of the base film.

In a case where the decorative layer 40 is formed by transfer, the decorative layer 40 includes, for example, the masking layer and the graphic layer excluding the light transmissive film.

The decorative layer 40 is bonded and fixed to the light guide member 20, for example, with a light transmissive adhesive.

(1-2-4) Light Absorbing Member

As illustrated in FIGS. 4, 5, and 6, the first light absorbing member 51 is placed in the first groove 26 (light absorbing member placing step). The first light absorbing member 51 is fixed to the first groove bottom 26b of the first groove 26, for example, with an adhesive. Similarly, the second light absorbing member 52 to the fourth light absorbing member 54 are placed in the second groove 27 to the fourth groove 29, respectively. Each of the first light absorbing member 51 to the fourth light absorbing member 54 is a cuboid rod-shaped member. However, the shape of each of the first light absorbing member 51 to the fourth light absorbing member 54 is not limited to a cuboid, and may be any shape that can be placed in each of the first groove 26 to the fourth groove 29.

In the first light absorbing member 51 to the fourth light absorbing member 54, the absorptivity of visible light is preferably 70% or more and more preferably 90% or more.

Here, an absorptivity ab [%] of visible light is expressed by the following equation, $$ab = 100 - re - tr$$

where re [%] is the reflectance and tr [%] is the transmittance when a light beam is vertically incident on a light absorbing member having a thickness of 1 mm.

In the case of referring to the absorptivity ab, the wavelength of incident light beam is in the visible light region (from 380 nm to 780 nm). For example, when the absorptivity is 70% or more, 70% or more in the entire visible light region is preferable.

The first light absorbing member 51 to the fourth light absorbing member 54 can be formed, for example, by injection-molding a resin into which a black pigment is added. The resin forming the first light absorbing member 51 to the fourth light absorbing member 54 is formed of the same resin as, for example, the resin forming the light guide member 20.

(2) Groove Forming Method

As described above, the decorative layer 40 formed simultaneously with the injection molding of the light guide member 20 is disposed on the second main surface 22 of the light guide member 20. At the time of this injection molding, the first groove 26 to the fourth groove 29 are not formed in the light guide member 20. The first groove 26 to the fourth groove 29 are formed, for example, by mechanically cutting the first main surface 21 (groove forming step). By forming the first groove 26 to the fourth groove 29 after injection molding as just described, sink marks can be prevented from being generated on the second main surface 22 of the light guide member 20. By forming the first groove 26 to the fourth groove 29 after injection molding, the beautiful decorative layer 40 can be obtained.

(3) LED Placing Method

The first LED 31, the second LED 32, and the third LED 33 are electrically connected to the control device 230 in this embodiment. For electrical connection of the first LED 31, the second LED 32, and the third LED 33, the display device 10 includes a circuit film 60. The circuit film 60 includes a resin film 61 and a wiring pattern 62 formed on the resin film 61 (see FIGS. 4 and 5). The circuit film 60 and the control device 230 are connected, for example, by using a flexible printed circuit board (not illustrated). The flexible printed circuit board and the wiring pattern 62 are connected, for example, by using an anisotropic conductive film (not illustrated). The first LED 31, the second LED 32, and the third LED 33 are connected to the wiring pattern 62, for example, by using a conductive adhesive (element placing step).

The circuit film 60 is preferably insert-molded when the light guide member 20 is injection-molded. By insert-molding the circuit film 60 to which the first LED 31, the second LED 32, and the third LED 33 are electrically connected, the first LED 31, the second LED 32, and the third LED 33 can be placed into the light guide member 20 at the same time as molding. Note that the circuit film 60 is not provided at locations where the first groove 26 to the fourth groove 29 are formed.

(4) Optical Path Forming Method

As described above, by forming the first groove 26 to the third groove 28 in the first main surface 21 of the light guide member 20, the first optical path OP1 to the third optical path OP3 are formed. The first optical path OP1 is formed between the first groove 26 and the second groove 27, the second optical path OP2 is formed between the first groove 26 and the third groove 28, and the third optical path OP3 is formed between the third groove 28 and the fourth groove 29.

The decorative layer 40 is formed on the second main surface 22 of the light guide member 20 forming the first optical path OP1 to the third optical path OP3. In order to suppress the attenuation of visible light passing through the first optical path OP1 to the third optical path OP3 by the decorative layer the decorative layer 40 includes a metal layer, a low refractive index layer for generating total internal reflection, or recesses and ridges for generating total internal reflection at locations forming the first optical path OP1 to the third optical path OP3. For example, when a normal ink layer such as a white ink layer is provided at locations forming the first optical path OP1 to the third optical path OP3, the visible light is diffused in the ink layer; therefore, luminance decreases.

(5) Groove Shape

The width and depth of the groove are quantified by the following simulation of light leakage. The simulation model illustrated in FIG. 7 is the display device 10 in which icons of 10 mm×10 mm are arranged side by side at intervals of 10 mm.

Figure 7:
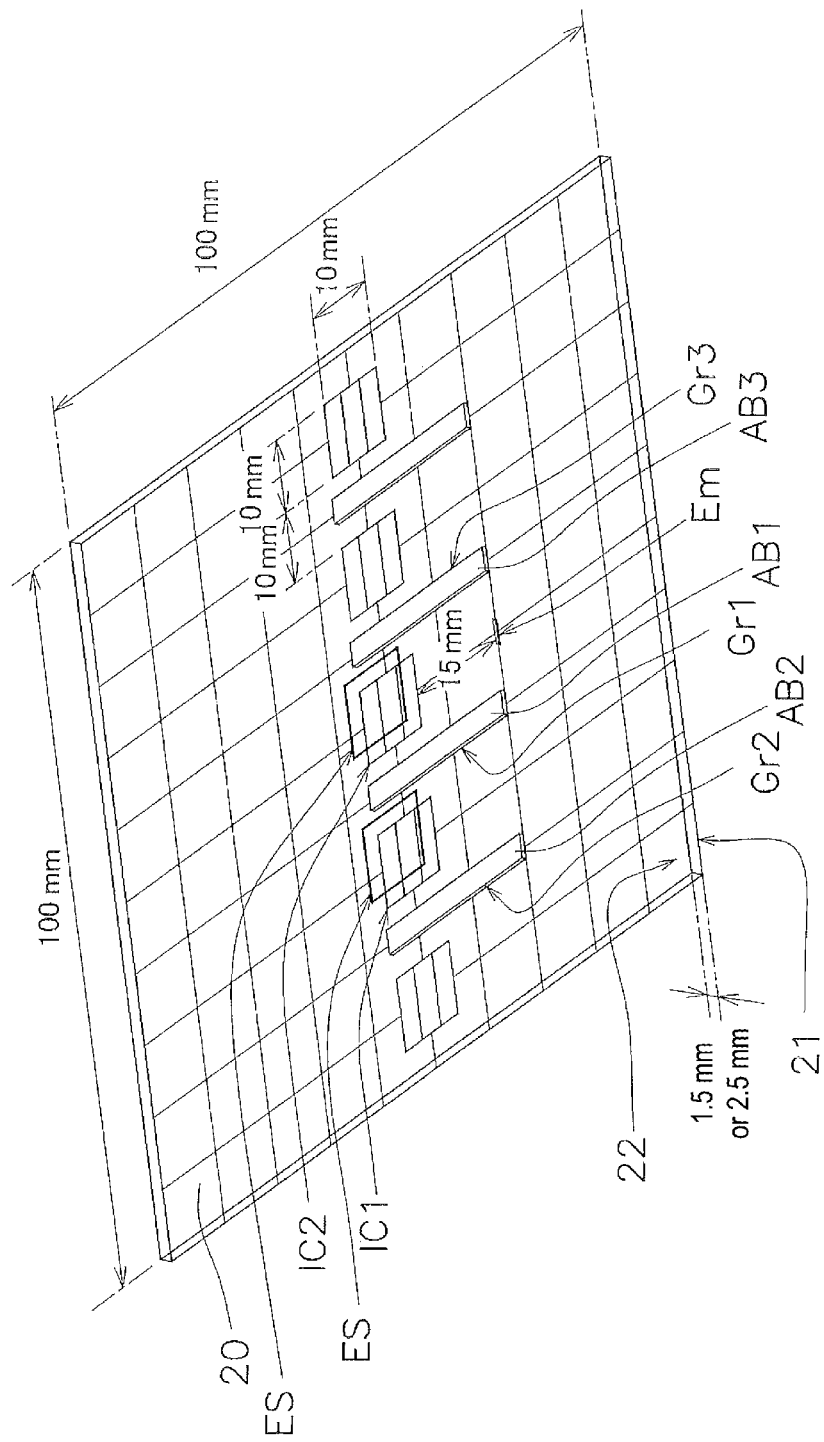
FIG. 7 is a perspective view illustrating a simulation model.

The light guide member 20 illustrated in FIG. 7 has a planar shape of a square of 100 mm×100 mm and has a thickness D of 1.5 mm or 2.5 mm.

A light leakage rate L is defined by the following equation (1). Note that an icon IC1 is an icon to be displayed by a first light-emitting element Em formed of an LED, and an icon IC2 is an icon disposed on the opposite side of the icon IC1 with a first groove Gr1 and a first light absorbing member AB1 interposed between the icon IC1 and the icon IC2.

L=(average illuminance of icon IC1)/(average illuminance of icon IC2)×100 (1)

As illustrated in FIG. 7, an evaluation surface ES for evaluating the illuminance of the icon is disposed directly above the display device 10. The average illuminance on the evaluation surface ES is calculated by simulation. In each case where the thickness D of the light guide member 20 of the display device 10 is 1.5 mm or 2.5 mm, the evaluation surface ES is disposed at a position of 2.51 mm from the bottom surface (first main surface 21) of the light guide member 20.

Figure 8:
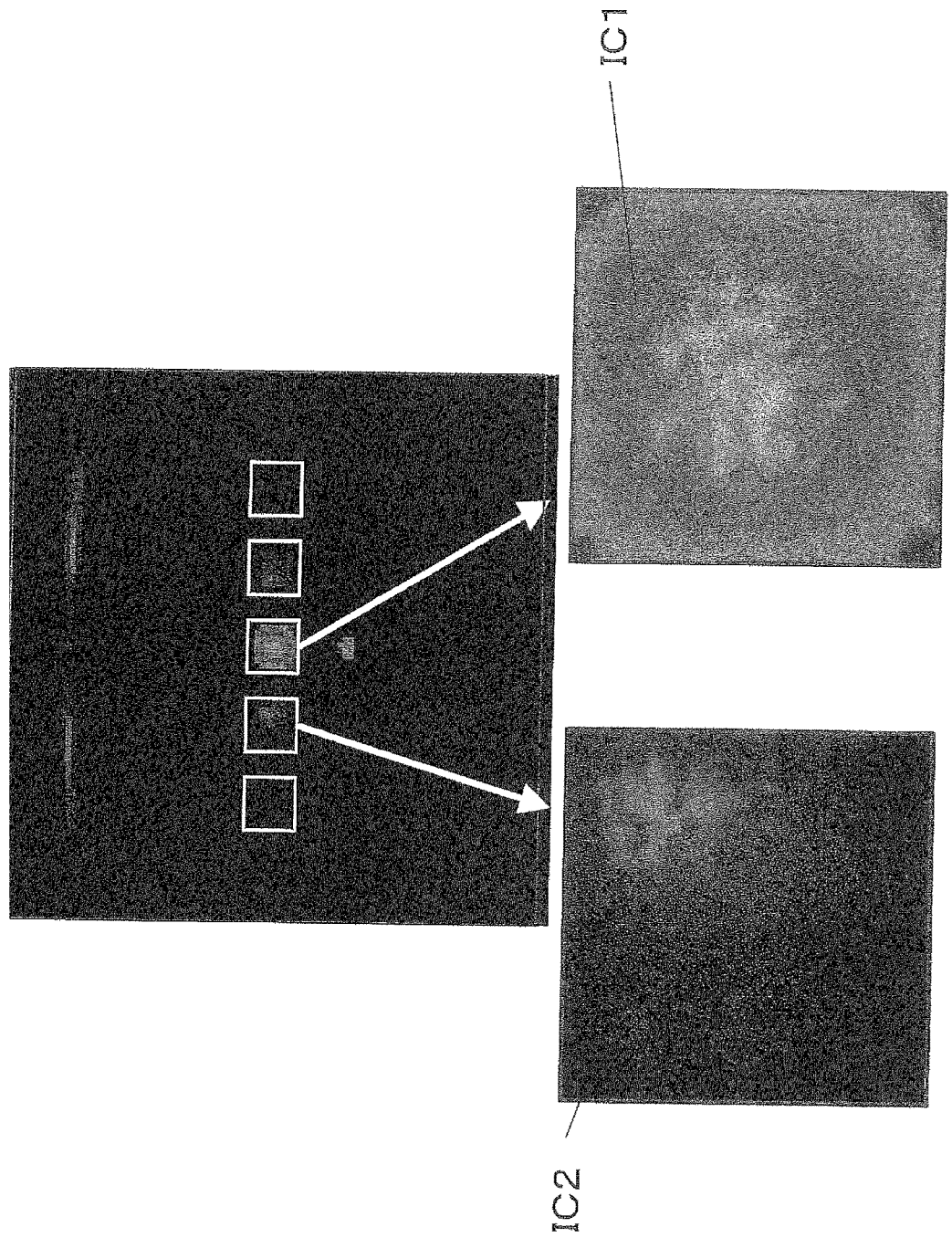
FIG. 8 is a diagram for illustrating a state of light leakage when there is no groove.
Figure 9:
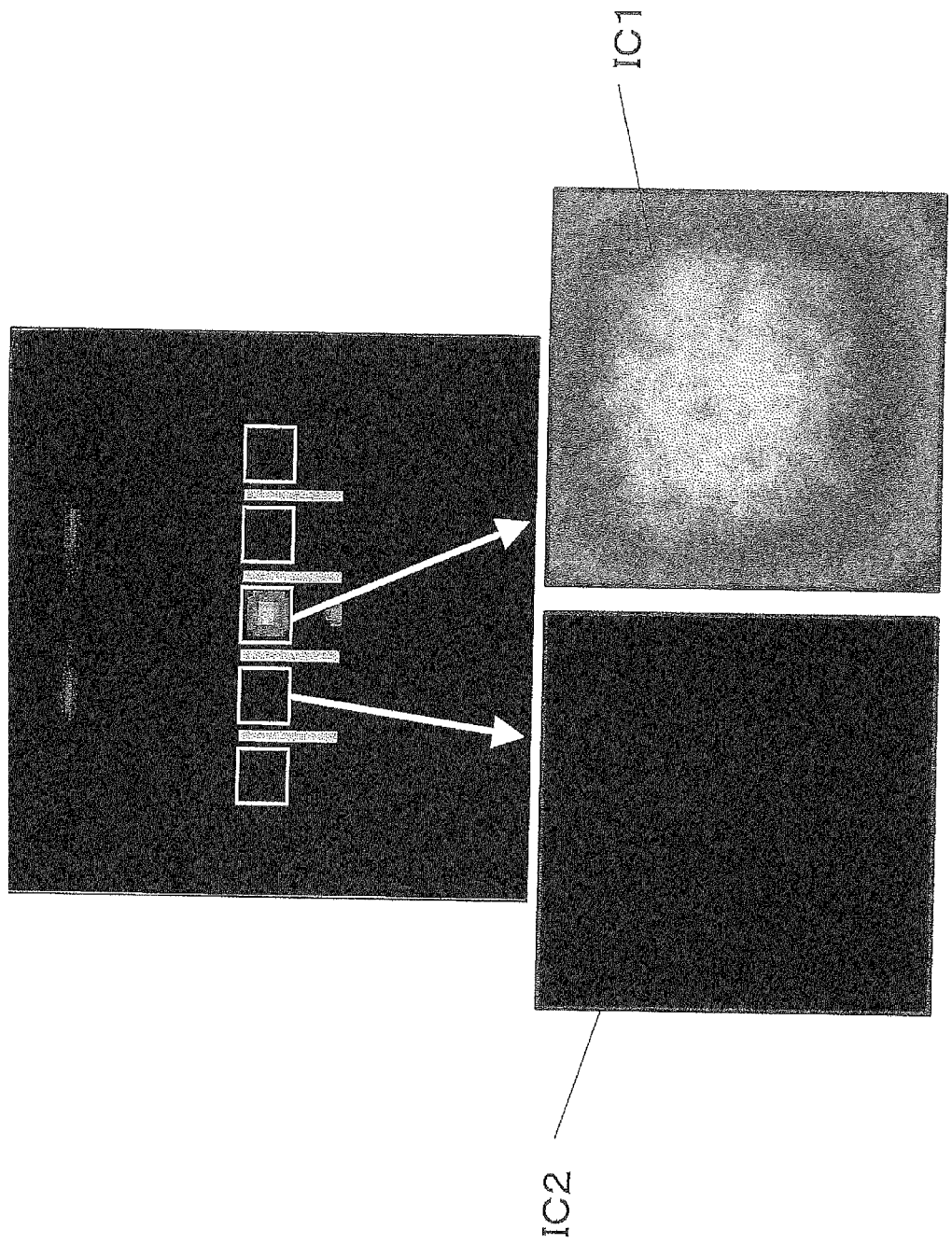
FIG. 9 is a diagram for illustrating a state of light leakage of 5% or less when there are grooves.

For example, when the thickness of the light guide member 20 is 1.5 mm, a width W of the first groove Gr1 is 3.0 mm, the plate thickness at a groove portion (a distance d from the groove bottom of the first groove Gr1 to the second main surface 22 of the light guide member 20) is 1.0 mm (d=1.0 mm is obtained by cutting the light guide member 20 by 0.5 mm from the first main surface 21), the first light absorbing member AB1 is black, the absorptivity of visible light is 90%, and the reflectance of visible light is 10%, the light leakage L is about 26% in the simulation result without the groove, and the light leakage L is about 4% in the simulation result with the first groove Gr1 and the first light absorbing member ABL The simulation results without grooves are indicated in FIG. 8. FIG. 9 indicates the simulation results when the first groove Gr1 and the first light absorbing member AB1 are provided. As can be seen by comparison with FIGS. 8 and 9, by suppressing the light leakage L to 5% or less, the icon IC2 that is not desired to be lighted can be prevented from being visually recognized by a user when the adjacent icon IC1 is lighted.

Note that the first light absorbing member AB1 is in contact with the entire groove bottom of the first groove Gr1 and is not in contact with the side surfaces of the first groove Gr1. Also, other grooves such as a second groove Gr2 and a third groove Gr3 have the same shape as that of the first groove Gr1, and other light absorbing members such as a second light absorbing member AB2 and a third light absorbing member AB3 have the same conditions as those of the first light absorbing member AB1.

Figure 10:
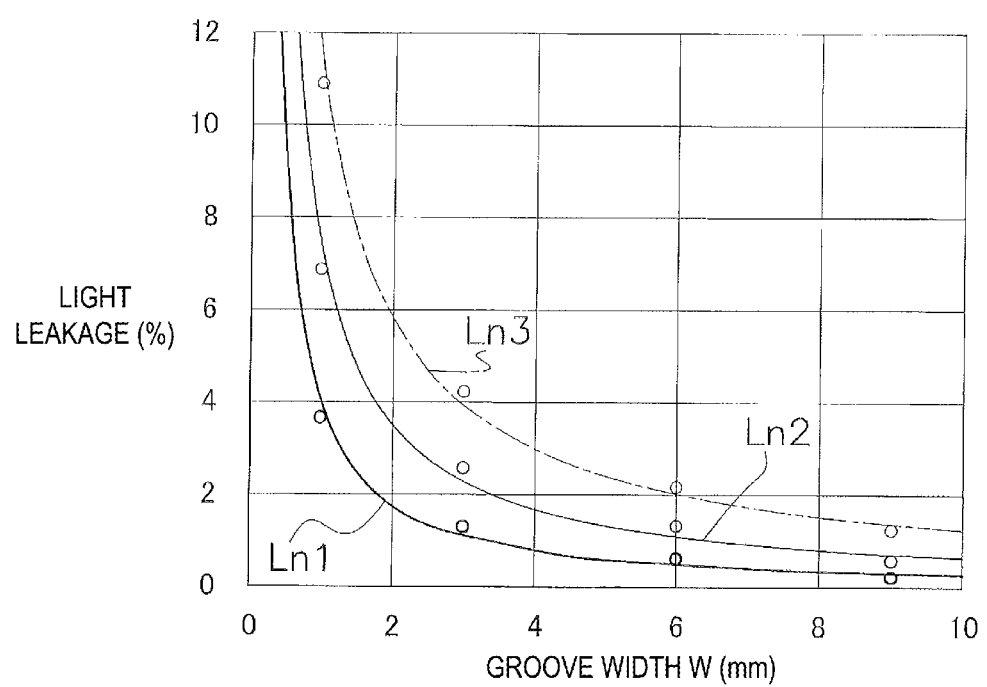
FIG. 10 is a graph indicating the relationship between the groove width and the light leakage when the absorptivity of visible light of a light absorbing member is 90%.

FIG. 10 indicates the simulation results in a case where the absorptivity of visible light of the first light absorbing member AB1 is 90% and the thickness D of the light guide member 20 is 1.5 mm. In FIG. 10, an approximate curve Ln1 indicates the relationship between the light leakage and the groove width W when the distance d from the groove bottom of the first groove Gr1 to the second main surface 22 of the light guide member 20 is 0.5 mm. An approximate curve Ln2 indicates the relationship between the light leakage and the groove width W when the distance d is 0.75 mm. An approximate curve Ln3 indicates the relationship between the light leakage and the groove width W when the distance d is 1.0 mm.

When the plate thickness (distance d) at the groove portion is 0.5 mm, the approximate curve Ln1 satisfies the relationship of equation (2), when the plate thickness (distance d) at the groove portion is 0.75 mm, the approximate curve Ln2 satisfies the relationship of equation (3), and when the plate thickness (distance d) at the groove portion is 1.0 mm, the approximate curve Ln3 satisfies the relationship of equation (4).

$$L=4.15W^{-1.20} \tag{2}$$

$$L=7.51W^{-1.07} \tag{3}$$

$$L=11.46W^{-0.96} \tag{4}$$

The light leakage L is expressed by the following equation (5) with coefficients $\alpha$ and $\beta$.

$$L=\alpha W^{\beta} \tag{5}$$

Since $\alpha$ and $\beta$ linearly change with respect to the distance d (the plate thickness at the groove portion), the following equation (6) is derived.

$$L=(1.46d+3.25)W^{0.474d-1.43} \tag{6}$$

When the light leakage is suppressed to 5% or less, the satisfaction of the relationship of the following expression (7) gives an indication.

$$5 \geq (1.46d+3.25)W^{0.474d-1.43} \tag{7}$$

Figure 11:
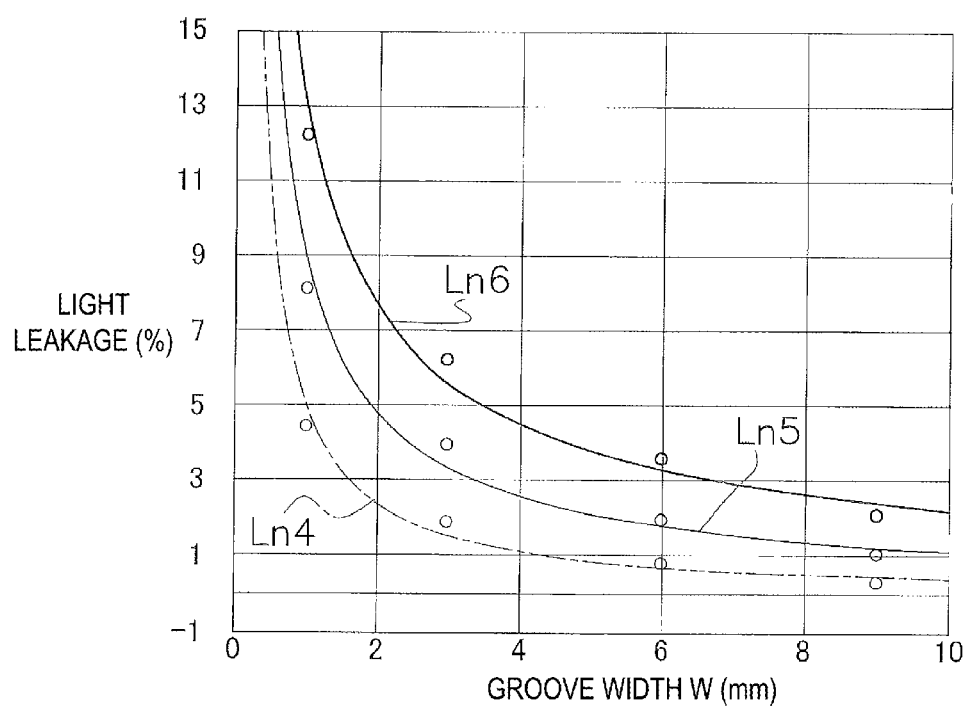
FIG. 11 is a graph indicating the relationship between the groove width and the light leakage when the absorptivity of visible light of the light absorbing member is 70%.

FIG. 11 indicates the simulation results in a case where the absorptivity of visible light of the first light absorbing member AB1 is 70% and the thickness D of the light guide member 20 is 1.5 mm. In FIG. 11, an approximate curve Ln4 indicates the relationship between the light leakage and the groove width W when the distance d from the groove bottom of the first groove Gr1 to the second main surface 22 of the light guide member 20 is 0.5 mm. An approximate curve Ln5 indicates the relationship between the light leakage and the groove width W when the distance d is 0.75 mm. An approximate curve Ln6 indicates the relationship between the light leakage and the groove width W when the distance d is 1.0 mm.

When the plate thickness (distance d) at the groove portion is 0.5 mm, the approximate curve Ln4 satisfies the relationship of equation (8), when the plate thickness (distance d) at the groove portion is 0.75 mm, the approximate curve Ln5 satisfies the relationship of equation (9), and when the plate thickness (distance d) at the groove portion is 1.0 mm, the approximate curve Ln6 satisfies the relationship of equation (10).

$$L=5.14W^{-1.06} \tag{8}$$

$$L=9.02W^{-0.892} \tag{9}$$

$$L=13.11W^{-0.767} \tag{10}$$

The light leakage L is expressed by the aforementioned equation (5) with the coefficients $\alpha$ and $\beta$.

Figure 12:
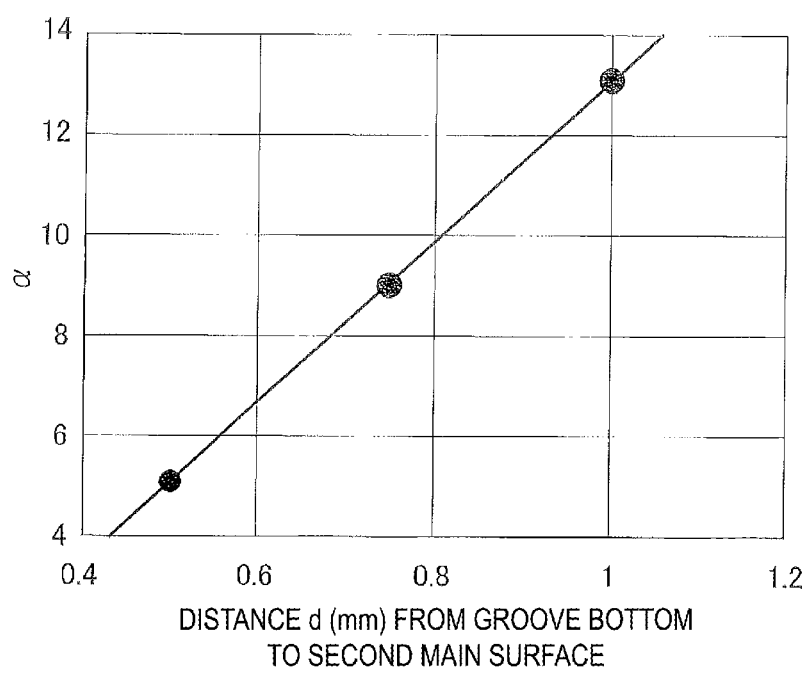
FIG. 12 is a graph indicating the relationship between a distance from a groove bottom to a second main surface and a coefficient $\alpha$.
Figure 13:
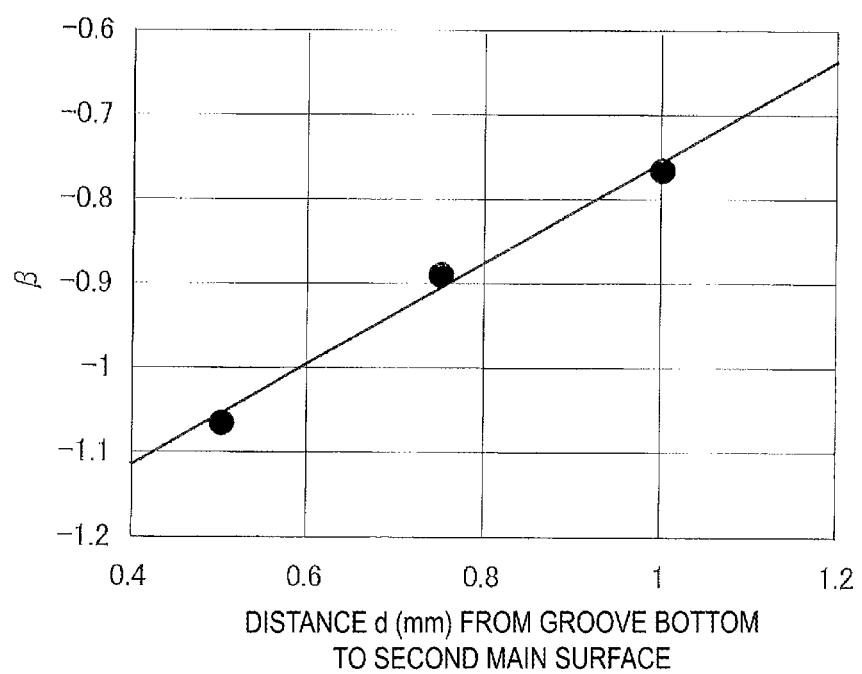
FIG. 13 is a graph indicating the relationship between the distance from the groove bottom to the second main surface and a coefficient $\beta$.

Since $\alpha$ and $\beta$ linearly change with respect to the distance d (the plate thickness at the groove portion) as illustrated in FIGS. 12 and 13, the following equation (11) is derived.

$$L=(15.9d-2.87)W^{0.602d-1.36} \tag{11}$$

When the light leakage is suppressed to 5% or less, the satisfaction of the relationship of the following expression (12) gives an indication.

$$5.00 \geq (15.9d-2.87)W^{0.602d-1.36} \tag{12}$$

Second Embodiment (6) Overview of Display Device

In the display device 10 according to the first embodiment, a case where the first light absorbing member 51 to the fourth light absorbing member 54 are disposed in the first groove 26 to the fourth groove 29, in particular, in the first groove bottom 26b to the fourth groove bottom 29b is described. However, as illustrated in FIGS. 14 and 15, light absorbing members may be disposed on the second main surface 22.

Figure 14:
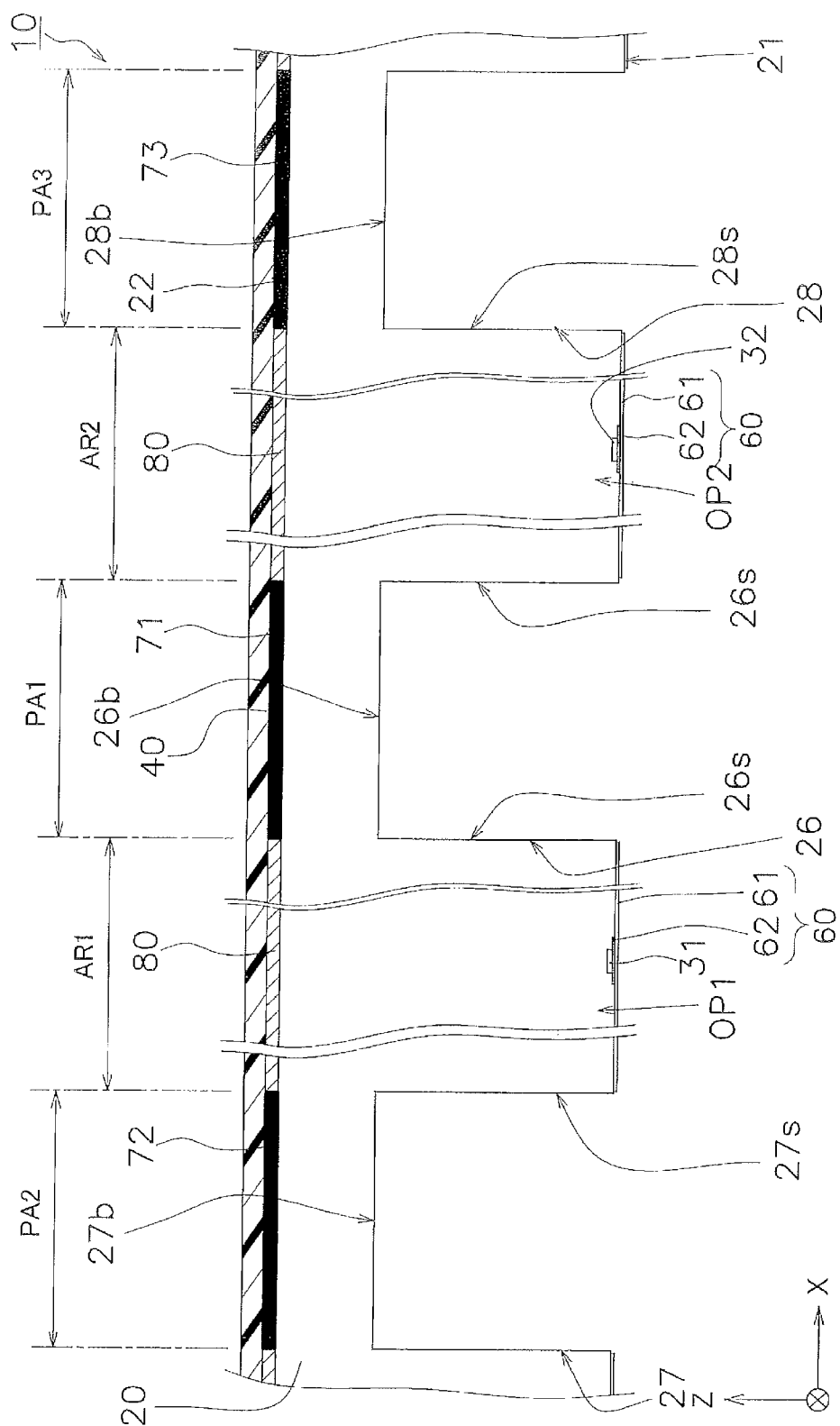
FIG. 14 is a cross-sectional view illustrating a cross-section of the display device according to a second embodiment.
Figure 15:
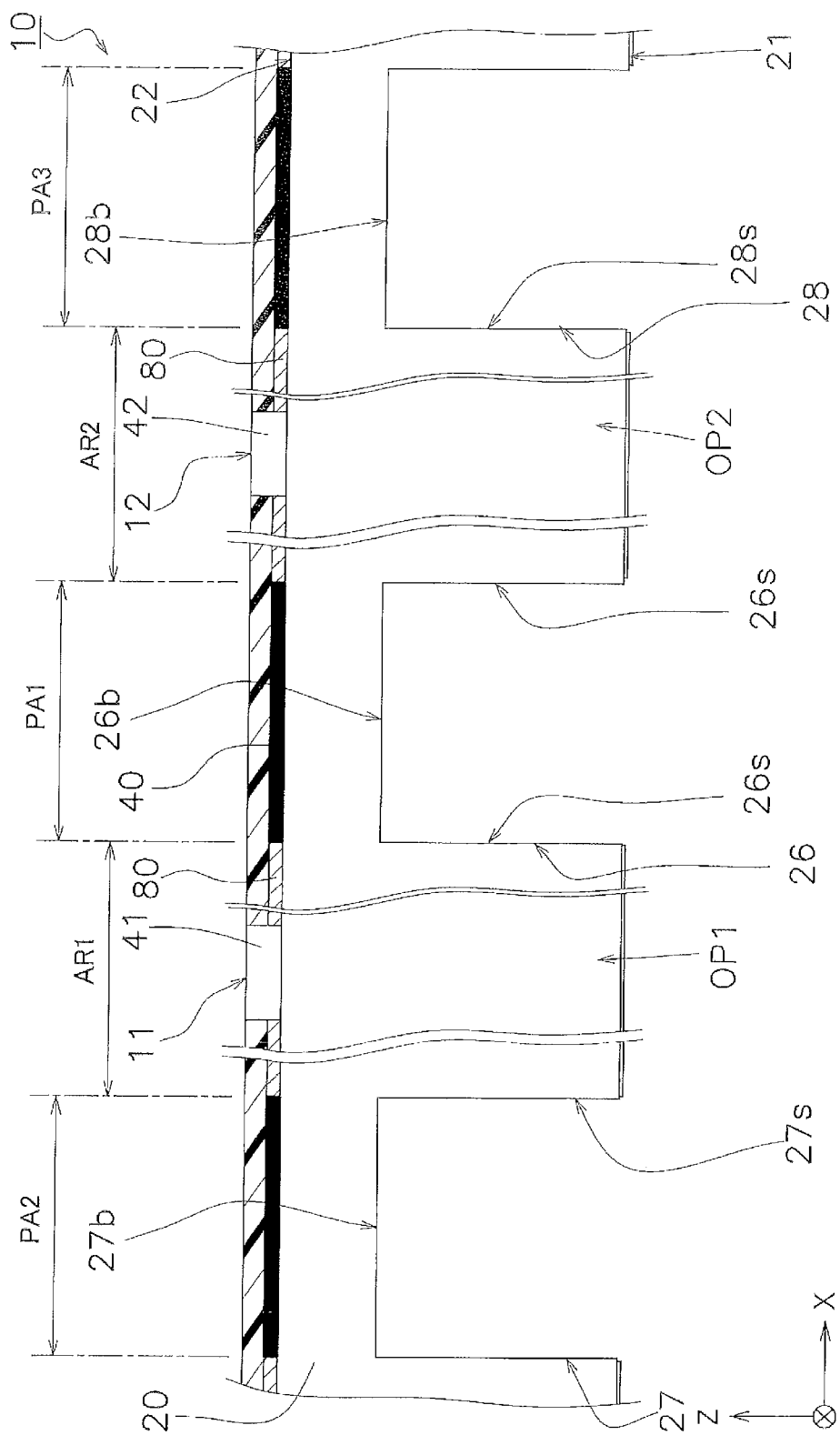
FIG. 15 is a cross-sectional view illustrating another cross-section of the display device according to the second embodiment.

In the display device 10 according to a second embodiment illustrated in FIGS. 14 and 15, a first light absorbing layer 71, a second light absorbing layer 72, and a third light absorbing layer 73 are light absorbing members. The first light absorbing layer 71, the second light absorbing layer 72, and the third light absorbing layer 73 are formed in the decorative layer 40. The first light absorbing layer 71 is disposed on a first groove facing portion PA1, which faces the first groove bottom 26b, of the second main surface 22 of the light guide member 20. In addition, the second light absorbing layer 72 and the third light absorbing layer 73 are respectively disposed on a second groove facing portion PA2, which faces the second groove bottom 27b, of the second main surface 22 and on a third groove facing portion PA3, which faces the third groove bottom 28b, of the second main surface 22. The first light absorbing layer 71, the second light absorbing layer 72, and the third light absorbing layer 73 are made of, for example, the same or similar material as that of the first light absorbing member 51, the second light absorbing member 52, and the third light absorbing member 53.

Also, the decorative layer 40 includes a metal layer 80 in the first region AR1 and the second region AR2 excluding the first light-emitting portion 41 and the second light-emitting portion 42. Although a case where the decorative layer 40 includes the metal layer 80 is described here, a low refractive index layer for generating total internal reflection may be provided instead of the metal layer 80.

(7) Modified Examples

(7-1) Modified Example A

In the first embodiment described above, a case where the first light absorbing member 51 to the fourth light absorbing member 54 are rod-shaped members is described, but the first light absorbing member 51 to the fourth light absorbing member 54 are not limited to rod-shaped members. The first light absorbing member 51 to the fourth light absorbing member 54 may be, for example, black strip-shaped films. In addition, the first light absorbing member 51 to the fourth light absorbing member 54 may be, for example, a black printed layer.

(7-2) Modified Example B

In the first embodiment described above, for example, a case where the first light absorbing member 51 is formed on the first groove bottom 26*b* of the first groove 26 and no light absorbing member is provided on the second main surface 22 of the light guide member 20 is described. Also, in the second embodiment described above, for example, a case where the first light absorbing layer 71 is formed on the first groove facing portion PA1 of the second main surface 22 of the light guide member 20 and no light absorbing member is provided on the first groove bottom 26*b* of the first groove 26 is described. However, the light absorbing members may be formed on both the first groove bottom 26*b* and the first groove facing portion PAL Similarly, the light absorbing members may be formed on both the second groove bottom 27*b* and the second groove facing portion PA2, and on both the third groove bottom 28*b* and the third groove facing portion PA3.

(7-3) Modified Example C

In the first embodiment and the second embodiment described above, a case where the second main surface 22 of the light guide member 20 is a flat surface is described. However, the second main surface 22 of the light guide member 20 is not limited to a flat surface. The second main surface 22 of the light guide member 20 may be, for example, a curved surface. Although a case where the second main surface 22 of the light guide member 20 is flat is described, the second main surface 22 of the light guide member 20 may have recesses and ridges.

(7-4) Modified Example D

In the first embodiment and the second embodiment described above, a case where the first groove 26 to the fourth groove 29 are formed by cutting the planar first main surface 21 of the light guide member 20 is described. However, the first main surface 21 before forming the first groove 26 to the fourth groove 29 may not be a flat surface and may be a curved surface.

(7-5) Modified Example E

Figure 16:
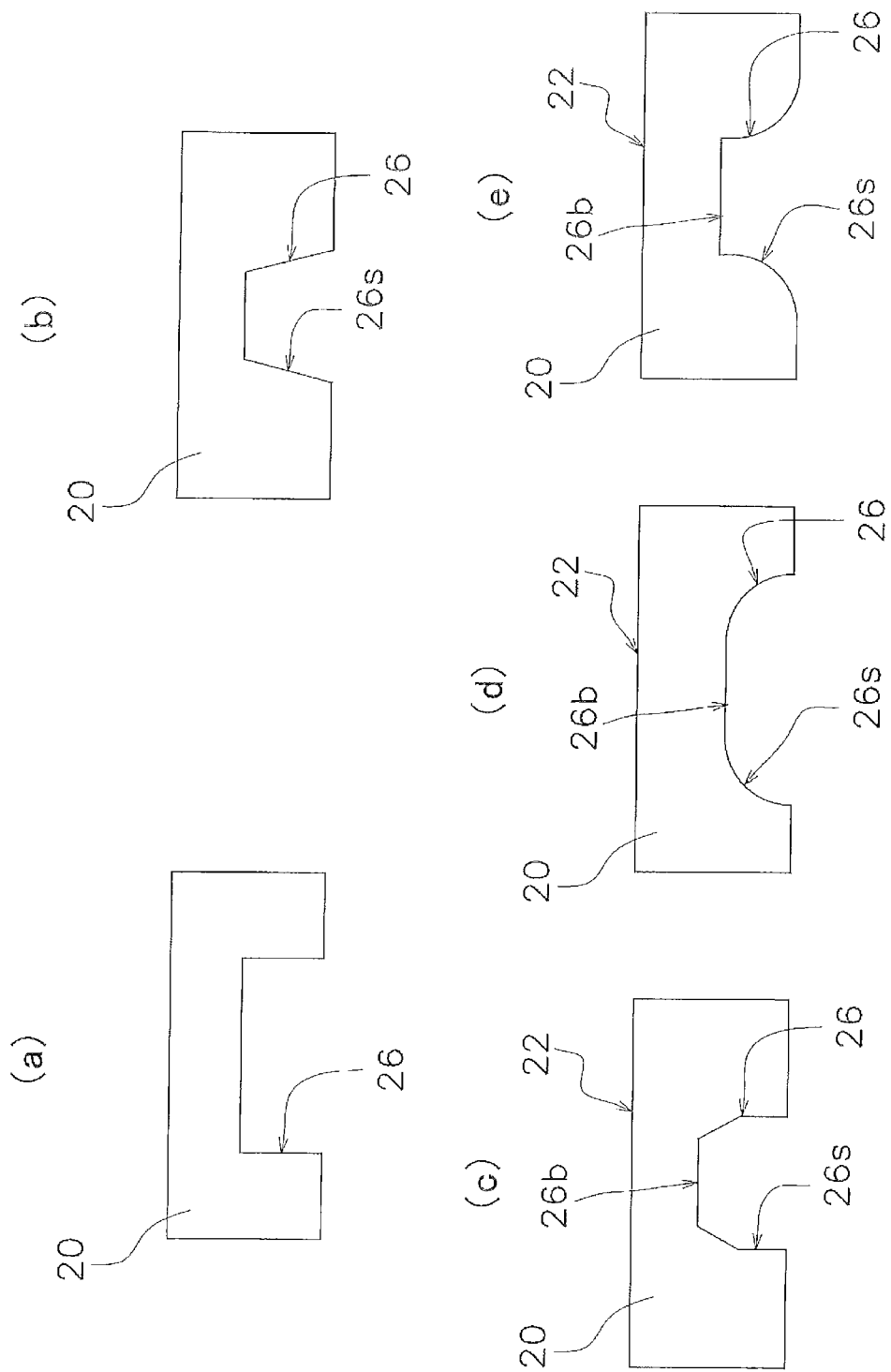
FIG. 16(*a*) is a cross-sectional view illustrating a first groove having a rectangular cross-sectional shape; (b) is a cross-sectional view illustrating the first groove having a trapezoidal cross-sectional shape; (c) is a cross-sectional view illustrating the first groove having a polygonal cross-sectional shape; (d) is a cross-sectional view illustrating the first groove with side surfaces each including an inwardly-recessed curved surface; and (e) is a cross-sectional view illustrating the first groove with side surfaces each including an inwardly-protruding curved surface.

In the first embodiment and the second embodiment described above, as illustrated in FIG. 16(*a*), a case where in the light guide member 20, for example, the cross-sectional shape of the first groove 26 is a rectangular shape is described. In addition, the cross-sectional shape of the first groove 26 illustrated in FIGS. 16(*a*) to 16(*e*) is a cross-sectional shape orthogonal to the longitudinal direction (the Y-axis direction in FIG. 4) of the first groove 26.

However, the cross-sectional shape of the groove formed in the light guide member 20 is not limited to a rectangular shape. For example, as in the first groove 26 illustrated in FIG. 16(*b*), the side surface 26*s* may have an inclined shape. In other words, the cross-sectional shape of the first groove 26 illustrated in FIG. 16(*b*) is a trapezoid. For example, as in the first groove 26 illustrated in FIG. 16(*c*), the cross-sectional shape of the side surface 26*s* may be a polygonal line that is bent in the middle. In other words, the cross-sectional shape of the first groove 26 illustrated in FIG. 16(*c*) is a polygonal shape. The first groove bottom 26*b* in FIG. 16(*c*) is a portion parallel to the second main surface 22. For example, as in the first groove 26 illustrated in FIG. 16(*d*) or 16(*e*), the side surface 26*s* may be a curved surface. The first groove bottom 26*b* in FIG. 16(*d*) or 16(*e*) is a portion parallel to the second main surface 22. The side surface 26*s* of the first groove 26 illustrated in FIG. 16(*d*) is a curved surface that is recessed toward the inside of the groove, and the side surface 26*s* of the first groove 26 illustrated in FIG. 16(*e*) is a curved surface that is protruded toward the inside of the groove.

(7-6) Modified Example F

Figure 17:
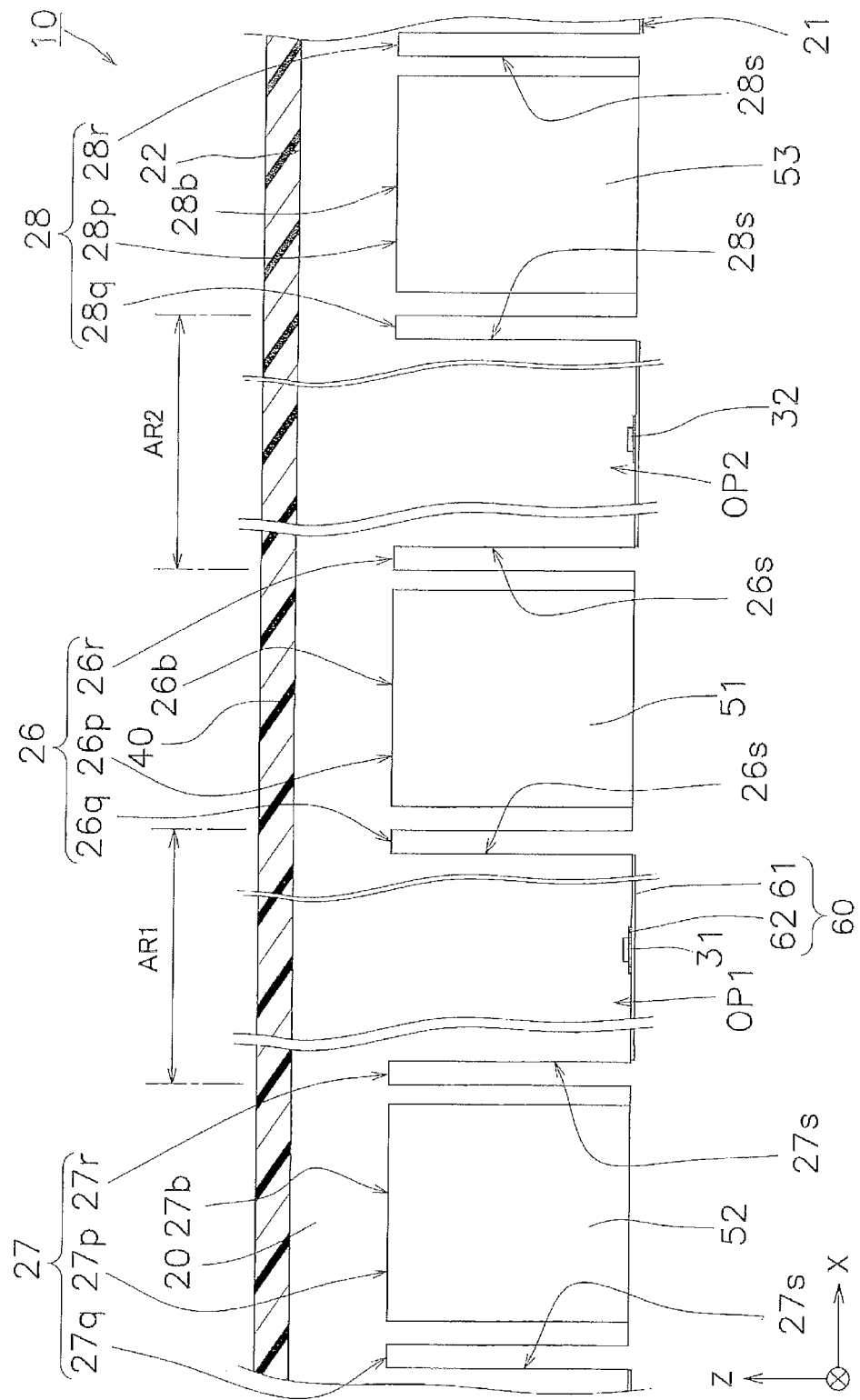
FIG. 17 is a cross-sectional view illustrating a cross-section of the display device according to Modified Example F.
Figure 18:
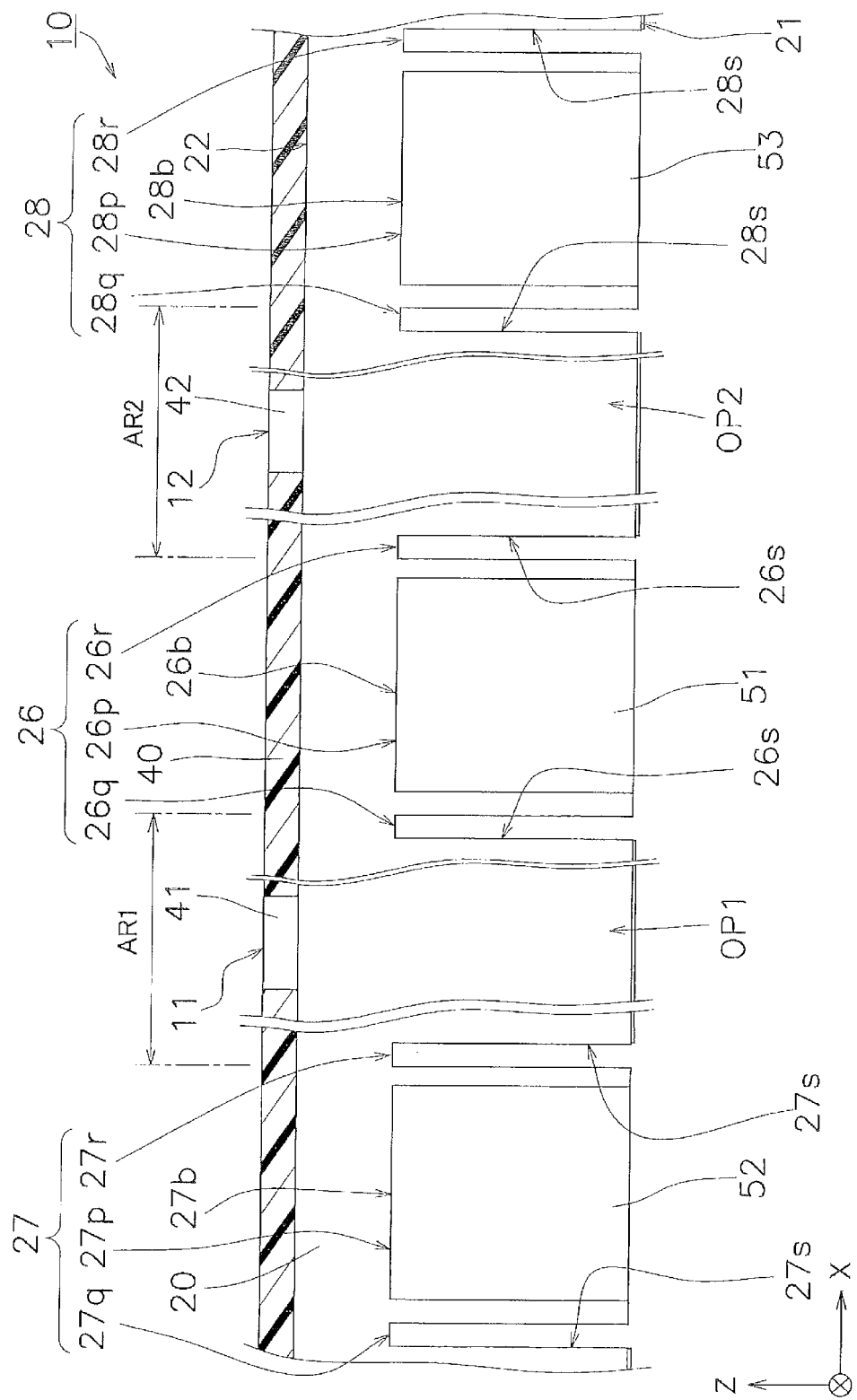
FIG. 18 is a cross-sectional view illustrating another cross-section of the display device according to Modified Example F.

In the first embodiment described above, each of the first groove 26 to the fourth groove 29 is formed of one groove. However, a groove such as the first groove to the fourth groove may be formed of a plurality of grooves. The first groove 26 illustrated in FIGS. 17 and 18 includes one main groove 26*p* and two sub-grooves 26*q*, 26*r* on both sides of the main groove. Similarly, the second groove 27 and the third groove 28 respectively include one main groove 2'7*p*, 28*p* and respectively include two sub-grooves 27*q*, 27*r*, and two sub-grooves 28*q*, 28*r*. As illustrated in FIGS. 17 and 18, the first light absorbing member 51, the second light absorbing member 52, and the third light absorbing member 53 are formed in the respective main grooves 26*p*, 27*p*, 28*p*. The first light absorbing member 51, the second light absorbing member 52, and the third light absorbing member 53 reach the side surfaces of the respective main grooves 26*p*, 27*p*, 28*p*. In order to obtain such a configuration, for example, the main grooves 26*p*, 27*p*, 28*p* may be entirely filled with a member that absorbs visible light. A method for filling the entire main grooves 26*p*, 27*p*, 28*p* includes, for example, a method for filling the entire main grooves 26*p*, 27*p*, 28*p* with a thermoplastic resin that absorbs visible light, or filling the entire main grooves 26*p*, 27*p*, 28*p* with a coating material that absorbs visible light.

The side surfaces 26*s* of the first groove 26 are a side surface of the sub-groove 26*q* in contact with the first region AR1 and a side surface of the sub-groove 26*r* in contact with the second region AR2. Since the light absorbing member is not disposed in the sub-grooves 26*q*, 26*r*, the visible light is not absorbed but reflected on the side surfaces 26*s* of the sub-grooves 26*q*, 26*r*. Similarly, in the second groove 27 and the third groove 28, the side surfaces 27*s*, 28*s* for reflecting visible light are respectively side surfaces of the sub-grooves 27*q*, 27*r*, and side surfaces of the sub-grooves 28*q*, 28*r*.

(7-7) Modified Example G

Figure 19:
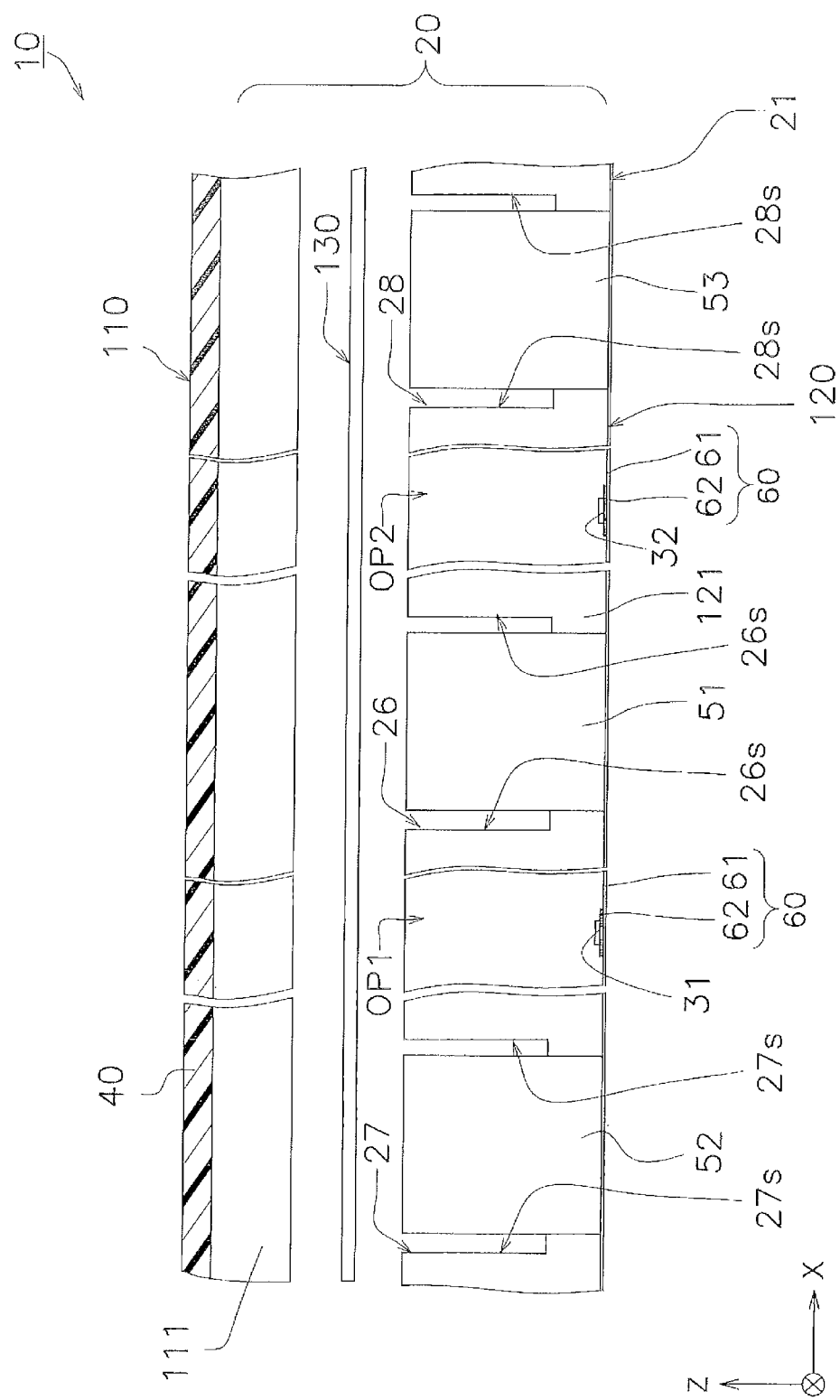
FIG. 19 is a cross-sectional view illustrating a cross-section of the display device according to Modified Example G.

In the first embodiment and the second embodiment described above, the first groove 26 to the fourth groove 29 are formed by mechanically cutting a resin plate through which the visible light passes and which is formed as the light guide member 20. However, the method for forming the groove is not limited to the method for mechanically cutting the resin plate. For example, as illustrated in FIG. 19, the display device 10 may be divided into an outer layer portion 110 on the front side and an inner layer portion 120 on the back side, and the outer layer portion 110 and the inner layer portion 120 may be bonded to each other with an adhesive layer 130 through which the visible light passes. For example, liquid optically clear adhesives (LOCA) can be used for the adhesive layer 130 through which the visible light passes.

The outer layer portion 110 includes a resin layer 111 which is made of a thermoplastic resin and through which the visible light passes, and the decorative layer 40 molded integrally with the resin layer 111. The decorative layer 40 is integrally molded with the resin layer 111 by decorating simultaneously with molding. The thickness of the outer layer portion 110 is, for example, 1.0 mm to 2.0 mm.

The inner layer portion 120 includes the circuit film 60, a resin mold layer 121, the first light absorbing member 51, the second light absorbing member 52, and the third light absorbing member 53. The circuit film 60, the resin mold layer 121, and the first light absorbing member 51, the second light absorbing member 52, and the third light absorbing member 53 are formed, for example, by insert-molding in which the circuit film 60, the first light absorbing member 51, the second light absorbing member 52, and the third light absorbing member 53 are inserted into the resin mold layer 121. The circuit film 60, the first light absorbing member 51, the second light absorbing member 52, and the third light absorbing member 53 may be bonded together in advance before insert-molding or may be bonded together at the time of insert-molding. In this case, the resin layer 111, the resin mold layer 121, and the adhesive layer 130 form the light guide member 20. The visible light emitted from the first LED 31 is absorbed by the first light absorbing layer 71 when passing through the resin layer 111 and the adhesive layer 130 and traveling from the first optical path OP1 to the second optical path OP2.

Note that the first groove 26 to the fourth groove 29 illustrated in FIG. 19 are dark grooves which are shielded grooves. A groove such as the first groove, the second groove, and the third groove of the present application may be a dark groove embedded in the light guide member.

(7-8) Modified Example H

Figure 20:
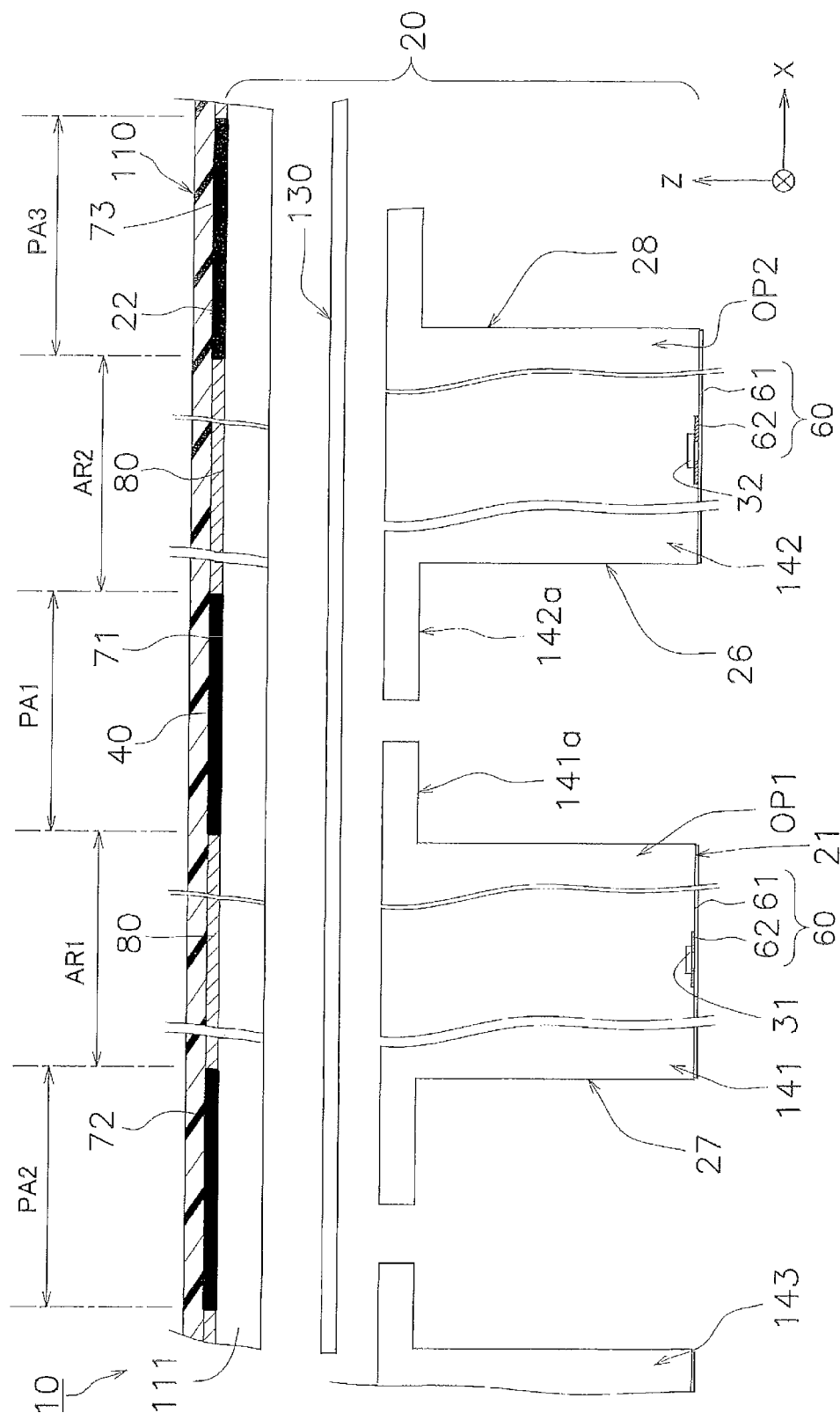
FIG. 20 is a cross-sectional view illustrating a cross-section of the display device according to Modified Example H.

As a method for forming the first groove 26 to the fourth groove 29 described in the first embodiment and the second embodiment described above, a plurality of resin blocks may be combined to form the grooves as illustrated in FIG. 20. The display device 10 illustrated in FIG. 20 includes the outer layer portion 110, a plurality of resin blocks 141, 142, 143, and the adhesive layer 130 through which the visible light passes. In this modification example, similarly to the second embodiment, the first light absorbing layer 71, the second light absorbing layer 72, and the third light absorbing layer 73 are provided on the second main surface 22. In the display device 10 illustrated in FIG. 20, the first optical path OP1 is located in the resin block 141, and the second optical path OP2 is located in the resin block 142. The first LED 31 that is the first light-emitting element is embedded in the resin block 141. Also, the second LED 32 that is the second light-emitting element is embedded in the resin block 142. The first groove 26 is formed between the first resin block 141 and the second resin block 142. The second groove 27 is formed between the first resin block 141 and the third resin block 143. For example, in order to form the first groove 26, for example, a protrusion 141*a* is provided at the first resin block 141, and a protrusion 142*a* is provided at the second resin block 142. The protrusions 141*a*, 141*b* are disposed opposed to each other to form a space, and the space serves as the first groove 26. However, there is another method for providing the first groove 26. For example, a spacer (not illustrated) that forms a gap between the first resin block 141 and the second resin block 142 may be used at the time of manufacturing the display device 10. In that case, the spacer is removed after manufacturing. The first groove 26 is disposed in the first groove facing portion PA1, the second groove 27 is disposed in the second groove facing portion PA2, and the third groove 28 is disposed in the third groove facing portion PA3. For example, the visible light emitted from the first LED 31 is absorbed by the first light absorbing layer 71 when passing through the resin layer 111 and the adhesive layer 130 and traveling from the first optical path OP1 to the second optical path OP2.

(7-9) Modified Example I

Figure 21:
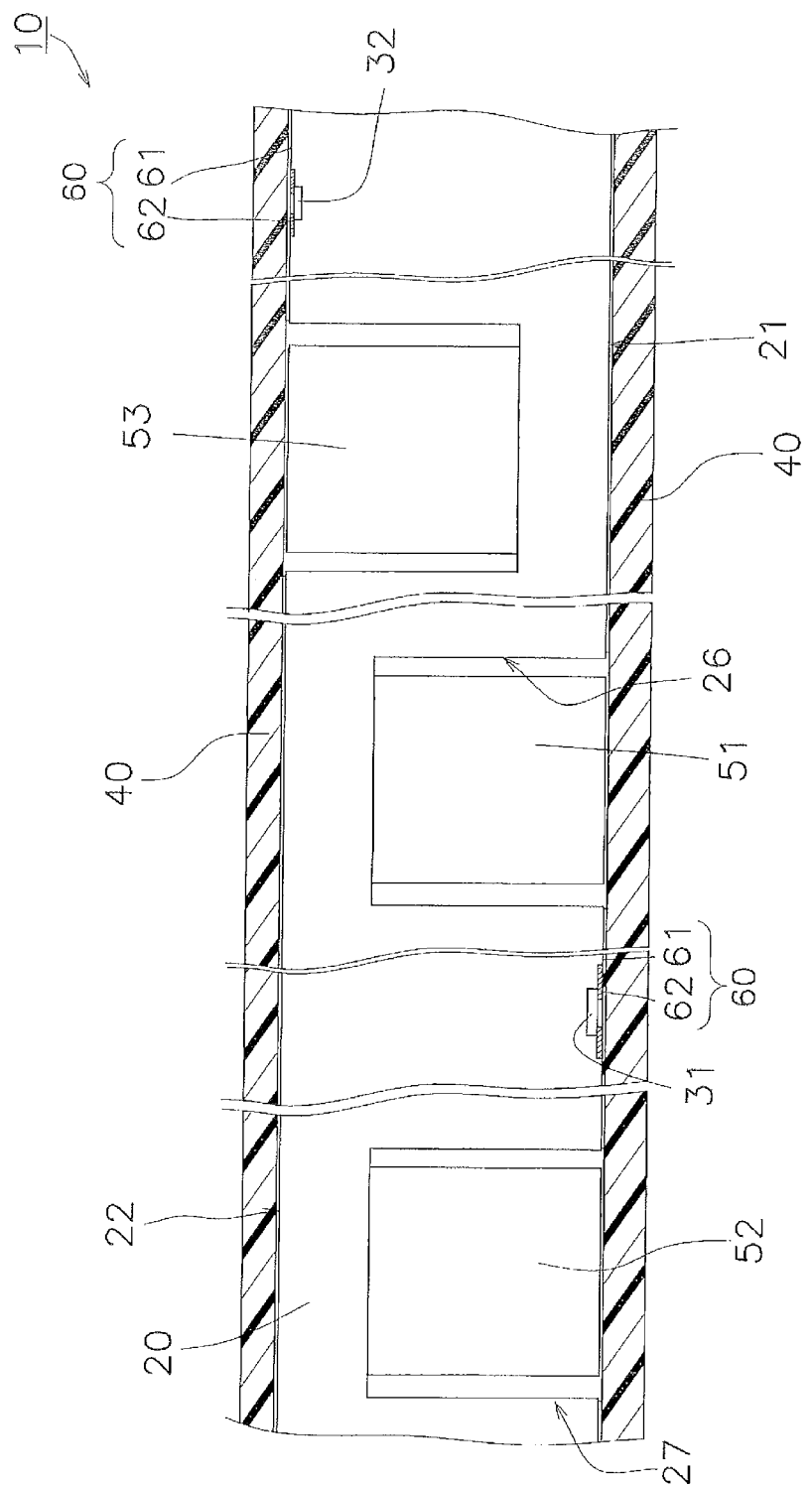
FIG. 21 is a cross-sectional view illustrating a cross-section of the display device according to Modified Example I.

In the first embodiment and the second embodiment described above, both the first LED 31 and the second LED 32 are disposed on the first main surface 21 of the light guide member 20. However, the first light-emitting element may be disposed on the first main surface, and the second light-emitting element may be disposed on the second main surface. In the display device 10 illustrated in FIG. 21, the first LED 31 is disposed on the first main surface 21 of the light guide member 20, and the second LED 32 is disposed on the second main surface 22 of the light guide member 20. Although not illustrated in the drawings, a first light-emitting portion illuminated by the first LED 31 is formed in the decorative layer 40 of the second main surface 22, and a second light-emitting portion illuminated by the second LED 32 is formed in the decorative layer 40 of the first main surface 21.

(7-10) Modified Example J

In the first embodiment and the second embodiment described above, a case where the first light absorbing member 51 and the second light absorbing member 52 or the first light absorbing layer 71 and the second light absorbing layer 72 are arranged in parallel on both sides of the first region AR1 in which the first LED 31 is arranged is described. However, the arrangement of the first light absorbing member 51 and the second light absorbing member 52 or the first light absorbing layer 71 and the second light absorbing layer 72 are not limited to such an arrangement. For example, the first light absorbing member 51 and the second light absorbing member 52 or the first light absorbing layer 71 and the second light absorbing layer 72 may be disposed so as to surround the complete periphery of the first region AR1. Such an arrangement of the light absorbing members or the light absorbing layers can be made in the same manner as for the second region AR2.

(7-11) Modified Example K

Figure 22:
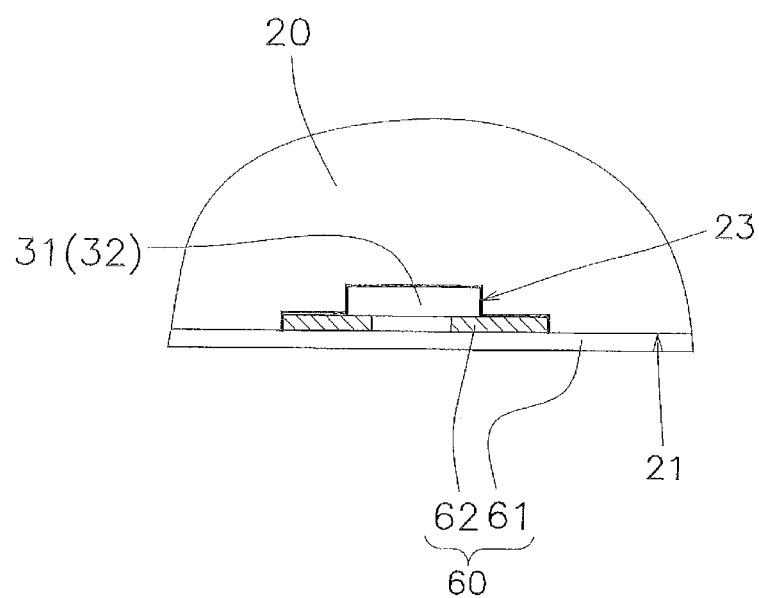
FIG. 22 is a cross-sectional view for illustrating a recess of a light guide member according to the first and second embodiments.
Figure 23:
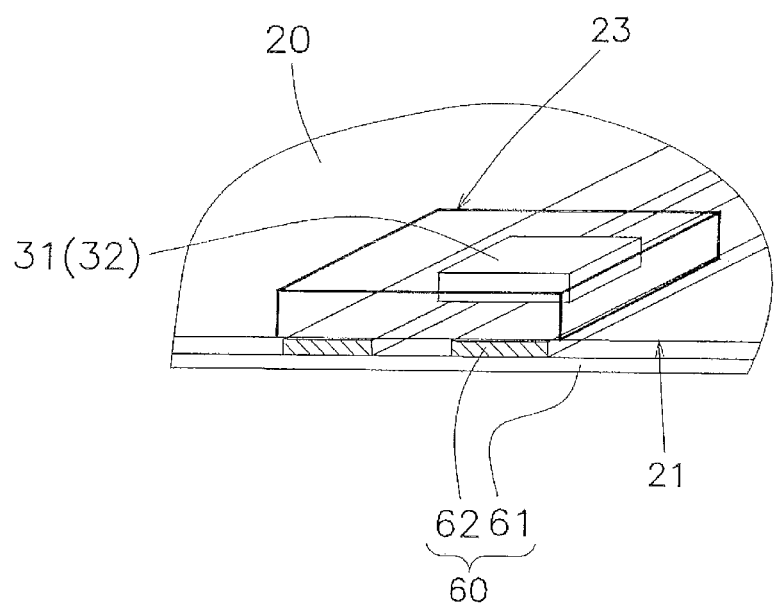
FIG. 23 is a perspective view for illustrating the recess of the light guide member according to Modified Example J.

In the first embodiment and the second embodiment described above, a case where, as illustrated in FIG. 22, at the time of insert-molding, a recess 23 is formed in the light guide member 20 and the first LED 31 is disposed in the recess 23 is described. However, a method for forming recesses in which the first light-emitting element, the second light-emitting element, and the third light-emitting element are disposed is not limited to the aforementioned method. For example, as illustrated in FIG. 23, the recess 23 may be formed in the light guide member 20 in advance, and then the circuit film 60 may be attached such that the first LED 31 is disposed in the recess 23.

(8) Features

8-1

In the display device 10 described above, the optical path from the first LED 31 that is the first light-emitting element toward the second region AR2 is blocked by the first groove 26. In addition, the visible light emitted from the first LED 31 through the clearance between the first groove 26 and the second main surface 22 of the light guide member 20 can be suppressed from entering the second region AR2 by the first light absorbing member 51 and/or the first light absorbing layer 71. As a result, the leakage of the visible light from the first optical path OP1 of the first LED 31 to the second optical path OP2 of the second LED 32 can be reduced. Similarly, the optical path from the second LED 32 that is the second light-emitting element toward the first region AR1 is blocked by the first groove 26. In addition, the visible light emitted from the second LED 32 through the clearance between the first groove 26 and the second main surface 22 of the light guide member 20 can be suppressed from entering the first region AR1 by the first light absorbing member 51 and/or the first light absorbing layer 71. As a result, the leakage of the visible light from the second optical path OP2 of the second LED 32 to the first optical path OP1 of the first LED 31 can be reduced.

8-2

In the display device 10 described above, the first light absorbing member 51 that is a light absorbing member is a rod-shaped member and is disposed in contact with the first groove bottom 26b of the first groove 26 and not in contact with the side surfaces 26s of the first groove 26. In such a display device 10, the leakage of the visible light passing through the clearance between the first groove bottom 26b and the second main surface 22 is reduced by the first light absorbing member 51. One of the side surfaces 26s of the first groove 26 can reflect the visible light of the first optical path OP1 toward the first optical path OP1 without reducing the visible light by the first light absorbing member 51, and the other of the side surfaces 26s can reflect the visible light of the second optical path OP2 toward the second optical path OP2 without reducing the visible light by the first light absorbing member 51. As a result, even when the first light absorbing member 51 is disposed in the first groove 26, a decrease in luminance of the first light-emitting portion 41 illuminated by the first LED 31 can be suppressed, and a decrease in luminance of the second light-emitting portion 42 illuminated by the second LED 32 can be suppressed.

8-3

In the display device 10 described above, even when the depth of the first groove 26 of the light guide member 20 is smaller than the distance between the first groove bottom 26b and the second main surface 22, the light leakage L may be suppressed to 5% or less. For example, when the thickness of the light guide member 20 described above is 1.5 mm, the width W of the first groove Gr1 is 3.0 mm, the plate thickness at the groove portion (the distance d from the groove bottom of the first groove Gr1 to the second main surface 22 of the light guide member 20) is 1.0 mm (obtained by cutting the light guide member 20 by 0.5 mm from the first main surface 21), the first light absorbing member AB1 is black, the absorptivity of visible light is 90%, and the reflectance of visible light is 10%, the light leakage L can be suppressed to 5% or less. In such a display device 10, although the light guide member 20 is as thin as, for example, 1.5 mm, the light guide member 20 is less likely to break at a portion of the first groove 26, for example, as compared with a case where the first groove 26 is cut by 0.75 mm or more.

8-4

In the display device 10 described above, the second groove 27 and the third groove 28 are formed in the first main surface 21 of the light guide member 20. The second light absorbing member 52 and the third light absorbing member 53 are formed on the second groove bottom 27b of the second groove 27 and the third groove bottom 28b of the third groove 28. Alternatively, the second light absorbing layer 72 and the third light absorbing layer 73 that are light absorbing members are disposed on the second groove facing portion PA2 and the third groove facing portion PA3 of the second main surface 22. Further, the first groove 26 and the second groove 27 are arranged so as to sandwich the first region AR1, and the first groove 26 and the third groove 28 are arranged so as to sandwich the second region AR2.

In such a display device 10, the visible light entering the first region AR1 from the second groove 27 side can be reduced by the second groove 27 and the second light absorbing member 52 or the second light absorbing layer 72. In addition, the visible light entering the second region AR2 from the third groove 28 side can be reduced by the third groove 28 and the third light absorbing member 53 or the third light absorbing layer 73. As a result, the second groove 27 and the second light absorbing member 52 or the second light absorbing layer 72 can suppress a decrease in light and dark contrast of the first light-emitting portion 41 between when the first LED 31 (first light-emitting element) emits light and when the first LED 31 (first light-emitting element) does not emit light. Similarly, the third groove 28 and the third light absorbing member 53 or the third light absorbing layer 73 can suppress a decrease in light and dark contrast of the second light-emitting portion 42 between when the second LED 32 (second light-emitting element) emits light and when the second LED 32 (second light-emitting element) does not emit light.

8-5

In the display device 10 described above, at least a portion of the first LED 31 (first light-emitting element) is disposed in the recess 23 (see FIGS. 22 and 23) of the light guide member 20 so as to be located between the first main surface 21 and the second main surface 22 of the light guide member 20. Similarly, at least a portion of the second LED 32 (second light-emitting element) is disposed in the recess 23. In the display device 10 configured as just described, the optical path from the first LED 31 toward the second region AR2 and the optical path from the second LED 32 toward the first region AR1 are blocked by the first groove 26. Since at least a portion of the first light-emitting element and the second light-emitting element can be disposed in the recess of the light guide member, the distance between the first light-emitting element and the first light-emitting portion and the distance between the second light-emitting element and the second light-emitting portion can be reduced while the thickness of the light guide member is reduced. As a result, the leakage of the visible light from the optical path of the first light-emitting element to the optical path of the second light-emitting element and the leakage of the visible light from the optical path of the second light-emitting element to the optical path of the first light-emitting element can be reduced.

8-6

The display device 10 described above includes the wiring pattern 62 to which the first LED 31 that is the first light-emitting element, the second LED 32 that is the second light-emitting element, and the third LED 33 that is another light-emitting element are electrically connected. The wiring pattern 62 is formed on the circuit film 60 that is disposed on the first main surface 21 of the light guide member 20 and is integrally molded with the light guide member 20. In such a display device 10, the thickness in a direction from the first main surface 21 toward the second main surface 22 (the Z direction in FIG. 4) of the display device 10 can be easily reduced.

8-7

The display device 10 described above can be configured such that the decorative layer 40 includes the metal layer 80 or the low refractive index layer in a portion opposed to the first region AR1 and the second region AR2. In the display device 10 configured as just described, the visible light can be suppressed from diffusing in the first region AR1 and the second region AR2 and a decrease in luminance of the first light-emitting portion 41 and the second light-emitting portion 42 can be suppressed.

8-8

A method for manufacturing the display device 10 described above can be configured to include a groove forming step of cutting the first main surface 21 of the light guide member 20 to form the first groove 26 passing between the first LED 31 that is the first light-emitting element and the second LED 32 that is the second light-emitting element. In the method for manufacturing the display device 10 configured as just described, since the first groove 26 is formed by cutting after molding the light guide member 20, sink marks of resin that may be generated when the groove is formed at the same time as molding can be prevented and the display device 10 with less distortion of the decorative layer 40 can be provided.

8-9

A molding step and an element placing step may be performed by electrically connecting the first LED 31 and the second LED 32 to the circuit film 60 and thereafter forming the circuit film 60 by insert-molding and forming the decorative layer 40 by in-mold molding. In the method for manufacturing the display device configured as just described, the first LED 31 and the second LED 32 are embedded in the light guide member 20 by insert-molding, and the first LED 31 and the second LED 32 can be easily placed in the light guide member 20. In particular, when insert-molding and in-mold molding are performed at the same time, the molding time in the molding step can be shortened.

8-10

In the display device 10 described above, the light guide member 20 can be configured such that the light guide member 20 is a plate-shaped member having a thickness of 2.5 mm or less, the absorptivity of visible light of the first light absorbing member 51 is 70% or more, and the width W of the first groove 26 and the distance d between the first groove bottom and the second main surface satisfy the relational expression $5.00 \geq (1.46d+3.25)W^{0.474}d-1.43$. In the display device 10 configured as just described, even when the light guide member 20 is a plate-shaped member having a small thickness of 2.5 mm, the leakage of visible light to the adjacent second optical path OP2 is easily suppressed to 5% or less.

Although the first and second embodiments of the present invention are described above, the present invention is not limited to the aforementioned embodiments, and various modifications can be made without departing from the scope of the invention. In particular, the plurality of embodiments and modified examples described herein can be combined randomly with one another as necessary.

REFERENCE SIGNS LIST

10 Display device
20 Light guide member
21 First main surface
22 Second main surface
26 First groove
26b First groove bottom
26s to 28s Side surface
27 Second groove
27b Second groove bottom
28 Third groove
28b Third groove bottom
31 First LED (example of first display element)
32 Second LED (example of second display element)
40 Decorative layer
41 First light-emitting portion
42 Second light-emitting portion
51 First light absorbing member
52 Second light absorbing member
53 Third light absorbing member
60 Circuit film
62 Wiring pattern
71 First light absorbing layer (example of light absorbing member)
72 Second light absorbing layer (example of light absorbing member)
73 Third light absorbing layer (example of light absorbing member)
80 Metal layer
PA1 First groove facing portion
PA2 Second groove facing portion
PA3 Third groove facing portion

The invention claimed is:

1. A display device, comprising:
a light guide member made of a resin and including a first main surface and a second main surface facing the first main surface, the light guide member allowing visible light to pass through the light guide member, the light guide member including a first groove formed in the first main surface;
a first light-emitting element disposed on the first main surface of the light guide member and arranged to emit visible light into the light guide member;
a second light-emitting element disposed on the first main surface or the second main surface of the light guide member and arranged to emit visible light into the light guide member;
a decorative layer molded integrally with the light guide member and provided on at least one of the first main surface and the second main surface of the light guide member, the decorative layer including a first light-emitting portion allowing the visible light emitted from the first light-emitting element to be radiated from the light guide member to an outside and a second light-emitting portion allowing the visible light emitted from the second light-emitting element to be radiated from the light guide member to the outside; and
a light absorbing member disposed on a first groove bottom of the first groove the light absorbing member having a higher absorptivity of visible light than the light guide member,
wherein the light absorbing member is a rod-shaped member disposed in contact with the first groove bottom and not in contact with a side surface of the first groove,
wherein the light guide member includes a first region in contact with one side surface of the first groove and a second region in contact with the other side surface of the first groove,
the first light-emitting element and the first light-emitting portion are disposed in the first region, and the second light-emitting element and the second light-emitting portion are disposed in the second region, and
the first groove is disposed at a position in which a first optical path from the first light-emitting element toward the second region is blocked and a second optical path from the second light-emitting element toward the first region is blocked.

2. The display device according to claim 1, wherein the light guide member is configured such that a depth of the first groove is smaller than a distance between the first groove bottom and the second main surface.

3. The display device according to claim 1, wherein
the light guide member includes a second groove and a third groove formed in the first main surface in addition to the first groove,
the light absorbing members are disposed at a second groove bottom of the second groove and a third groove bottom of the third groove, and
the first groove and the second groove are disposed to sandwich the first region, and the first groove and the third groove are disposed to sandwich the second region.

4. The display device according to claim 1, further comprising a circuit film including a wiring pattern, the first light-emitting element and the second light-emitting element being electrically connected to the wiring pattern, the circuit film being disposed on the first main surface of the light guide member and integrally molded with the light guide member.

5. The display device according to claim 1, wherein the decorative layer includes a metal layer or a low refractive index layer in a portion facing the first region and the second region.

6. A method for manufacturing a display device, the method comprising:
a molding step of integrally molding a circuit film on a first main surface of a light guide member that is made of a resin and allows visible light to pass through the light guide member, and integrally molding a decorative layer on a second main surface of the light guide member;
an element placing step of electrically connecting a first light-emitting element and a second light-emitting element to the circuit film and placing the first light-emitting element and the second light-emitting element such that the first light-emitting element and the second light-emitting element are configured to emit visible light into the light guide member;
a groove forming step of cutting the first main surface of the light guide member to form a first groove passing between the first light-emitting element and the second light-emitting element; and
a light absorbing member placing step of placing a light absorbing member disposed on a first groove bottom of the first groove, the light absorbing member having a higher absorptivity of visible light than the light guiding member, wherein the light absorbing member placing step includes disposing the light absorbing member to be in contact with the first groove bottom and not in contact with a side surface of the first groove and wherein the light absorbing member is a rod-shaped member,
wherein the decorative layer includes a first light-emitting portion allowing the visible light emitted from the first light-emitting element to be radiated from the light guide member to an outside and a second light-emitting portion allowing the visible light emitted from the second light-emitting element to be radiated from the light guide member to the outside,
the light guide member includes a first region which is in contact with one side surface of the first groove and in which the first light-emitting element and the first light-emitting portion are disposed, and a second region which is in contact with the other side surface of the first groove and in which the second light-emitting element and the second light-emitting portion are disposed, and
the first groove is disposed at a position in which an optical path from the first light-emitting element toward the second region is blocked and an optical path from the second light-emitting element toward the first region is blocked.

7. The method for manufacturing a display device according to claim 6, wherein the molding step and the element placing step are performed by electrically connecting the first light-emitting element and the second light-emitting element to the circuit film and thereafter forming the circuit film by insert-molding and forming the decorative layer by in-mold molding.

8. The display device according to claim 1, wherein the first light-emitting element emits visible light through the first optical path within the first region to illuminate a first icon formed in the first light-emitting portion.

9. The display device according to claim 8, wherein the second light-emitting element emits visible light through the second optical path within the second region to illuminate a second icon formed in the second light-emitting portion.

10. The display device according to claim 9, wherein the visible light emitted from the first light-emitting element is blocked from the second optical path by the first groove.

11. The display device according to claim 10, wherein the visible light emitted from the second light-emitting element is blocked from the first optical path by the first groove.

12. The display device according to claim 8, further comprising a control device to control the first light-emitting element to emit visible light through the first optical path.

13. The display device according to claim 9, further comprising a control device to control the second light-emitting element to emit visible light through the second optical path.

14. The display device according to claim 1, further comprising a first light absorbing layer disposed on a first groove facing portion of the second main surface of the light guide member, wherein the first groove facing portion faces the first groove.

15. The display device according to claim 6, wherein the light absorbing member is formed by injection-molding the resin of the light guide member into which a black pigment is added.

16. A display device comprising:
a light guide member made of a resin and including a first main surface and a second main surface facing the first main surface, the light guide member allowing visible light to pass through the light guide member, the light guide member including a first groove formed in the second main surface;
a first light-emitting element disposed on the first main surface of the light guide member and arranged to emit visible light into the light guide member;
a second light-emitting element disposed on the first main surface or the second main surface of the light guide member and arranged to emit visible light into the light guide member;
a decorative layer molded integrally with the light guide member and provided on at least one of the first main surface and the second main surface of the light guide member, the decorative layer including a first light-emitting portion allowing the visible light emitted from the first light-emitting element to be radiated from the light guide member to an outside and a second light-emitting portion allowing the visible light emitted from the second light-emitting element to be radiated from the light guide member to the outside; and
a light absorbing layer disposed in the first groove formed in the second main surface, the light absorbing member having a higher absorptivity of visible light than the light guide member,
wherein the light guide member includes a first region in contact with one side surface of the first groove and a second region in contact with the other side surface of the first groove,
the first light-emitting element and the first light-emitting portion are disposed in the first region, and the second light-emitting element and the second light-emitting portion are disposed in the second region, and
the first groove is disposed at a position in which the light absorbing layer is positioned between the first region and the second region.

17. The display device of claim 16, wherein
the light guide member includes a second groove and a third groove formed in the second main surface in addition to the first groove,
the light absorbing layers are disposed in the second groove and the third groove, and
the first groove and the second groove are disposed to sandwich the first region, and the first groove and the third groove are disposed to sandwich the second region.

18. The display device of claim 16, further comprising a circuit film including a wiring pattern, the first light-emitting element and the second light-emitting element being electrically connected to the wiring pattern, the circuit film being disposed on the first main surface of the light guide member and integrally molded with the light guide member.

19. The display device of claim 16, wherein the decorative layer includes a metal layer or a low refractive index layer in a portion facing the first region and the second region.

20. The display device of claim 16, wherein the first light-emitting element emits visible light through the first optical path within the first region to illuminate a first icon formed in the first light-emitting portion.

* * * * *